(12) United States Patent
Forbes

(10) Patent No.: US 8,101,992 B2
(45) Date of Patent: Jan. 24, 2012

(54) MEMORY ARRAY WITH SURROUNDING GATE ACCESS TRANSISTORS AND CAPACITORS WITH GLOBAL AND STAGGERED LOCAL BIT LINES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/950,088

(22) Filed: Nov. 19, 2010

(65) Prior Publication Data

US 2011/0121383 A1    May 26, 2011

Related U.S. Application Data

(60) Continuation of application No. 12/394,711, filed on Feb. 27, 2009, now Pat. No. 7,838,360, which is a continuation of application No. 11/462,617, filed on Aug. 4, 2006, now Pat. No. 7,510,954, which is a division of application No. 11/128,585, filed on May 13, 2005, now Pat. No. 7,120,046.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........ 257/329; 257/302; 257/401; 438/197; 438/238

(58) Field of Classification Search .................. 257/302, 257/401, 329; 438/197, 238, 268, 296, 587
See application file for complete search history.

(56) References Cited

U.S. PATENT DOCUMENTS

| 3,731,287 A | 5/1973 | Seely et al. |
| 3,732,287 A | 5/1973 | Himmele et al. |
| 3,941,629 A | 3/1976 | Jaffe |
| 4,139,442 A | 2/1979 | Bondur et al. |
| 4,234,362 A | 11/1980 | Riseman |
| 4,333,964 A | 6/1982 | Ghezzo |
| 4,419,809 A | 12/1983 | Riseman et al. |

(Continued)

FOREIGN PATENT DOCUMENTS

JP    53148389 A2    12/1978

(Continued)

OTHER PUBLICATIONS

"Notes from IEDM, Part 3,", http://www.thinfilmmfg.com/Noteworthy/Noteworthy01/IEDM12Dec01.htm, Dec. 12, 2001, 2 pages.

(Continued)

*Primary Examiner* — Phuc Dang
(74) *Attorney, Agent, or Firm* — Knobbe Martens Olson & Bear, LLP

(57) ABSTRACT

A memory array with staggered local data/bit lines extending generally in a first direction formed in an upper surface of a substrate and memory cell access transistors extending generally upward and aligned generally atop a corresponding local data/bit line. Selected columns of the memory cell access transistors are sacrificed to define local data/bit access transistors which are interconnected with overlying low resistance global data/bit lines. The global data/bit lines provide selectable low resistance paths between memory cells and sense amplifiers. The sacrificed memory cell access transistors and staggered local data/bit lines provide increased footprints for sense amplifiers to facilitate increased circuit integration.

17 Claims, 15 Drawing Sheets

U.S. PATENT DOCUMENTS

| | | |
|---|---|---|
| 4,432,132 A | 2/1984 | Kinsbron et al. |
| 4,470,062 A | 9/1984 | Muramatsu |
| 4,472,459 A | 9/1984 | Fisher |
| 4,502,914 A | 3/1985 | Trumpp et al. |
| 4,508,579 A | 4/1985 | Goth et al. |
| 4,508,757 A | 4/1985 | Fabricius et al. |
| 4,551,910 A | 11/1985 | Patterson |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |
| 4,716,131 A | 12/1987 | Okazawa et al. |
| 4,746,630 A | 5/1988 | Hui et al. |
| 4,776,922 A | 10/1988 | Bhattacharyya et al. |
| 4,789,560 A | 12/1988 | Yen |
| 4,838,991 A | 6/1989 | Cote et al. |
| 4,903,344 A | 2/1990 | Inoue |
| 4,959,325 A | 9/1990 | Lee et al. |
| 4,965,221 A | 10/1990 | Dennison et al. |
| 4,983,544 A | 1/1991 | Lu et al. |
| 5,013,680 A | 5/1991 | Lowrey et al. |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,087,586 A | 2/1992 | Chan et al. |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,210,046 A | 5/1993 | Crotti |
| 5,252,504 A | 10/1993 | Lowrey et al. |
| 5,260,229 A | 11/1993 | Hodges et al. |
| 5,295,092 A | 3/1994 | Hotta |
| 5,305,252 A | 4/1994 | Takanori |
| 5,316,966 A | 5/1994 | Van Der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,358,894 A | 10/1994 | Fazan et al. |
| 5,374,572 A | 12/1994 | Roth et al. |
| 5,409,563 A | 4/1995 | Cathey |
| 5,414,287 A | 5/1995 | Hong |
| 5,416,350 A | 5/1995 | Watanabe |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,497,017 A | 3/1996 | Gonzales |
| 5,502,320 A | 3/1996 | Yamada |
| 5,514,885 A | 5/1996 | Myrick |
| 5,539,229 A | 7/1996 | Noble et al. |
| 5,561,308 A | 10/1996 | Kamata et al. |
| 5,563,012 A | 10/1996 | Neisser |
| 5,569,620 A | 10/1996 | Linn et al. |
| 5,583,065 A | 12/1996 | Miwa |
| 5,596,759 A | 1/1997 | Miller et al. |
| 5,604,159 A | 2/1997 | Cooper et al. |
| 5,607,874 A | 3/1997 | Wang et al. |
| 5,638,318 A | 6/1997 | Seyyedy |
| 5,670,794 A | 9/1997 | Manning |
| 5,675,164 A | 10/1997 | Brunner et al. |
| 5,677,865 A | 10/1997 | Seyyedy |
| 5,679,591 A | 10/1997 | Lin et al. |
| 5,680,344 A | 10/1997 | Seyyedy |
| 5,700,733 A | 12/1997 | Manning |
| 5,705,321 A | 1/1998 | Brueck et al. |
| 5,747,377 A | 5/1998 | Wu |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,795,830 A | 8/1998 | Cronin et al. |
| 5,798,544 A | 8/1998 | Ohya et al. |
| 5,804,458 A | 9/1998 | Tehrani et al. |
| 5,821,600 A | 10/1998 | Chan |
| 5,834,359 A | 11/1998 | Jeng et al. |
| 5,841,611 A | 11/1998 | Sakakima et al. |
| 5,861,328 A | 1/1999 | Tehrani et al. |
| 5,864,496 A | 1/1999 | Mueller et al. |
| 5,892,708 A | 4/1999 | Pohm |
| 5,895,238 A | 4/1999 | Mitani |
| 5,895,273 A | 4/1999 | Burns et al. |
| 5,899,727 A | 5/1999 | Hause et al. |
| 5,902,690 A | 5/1999 | Tracy et al. |
| 5,905,285 A | 5/1999 | Gardner et al. |
| 5,907,170 A | 5/1999 | Forbes |
| 5,909,618 A | 6/1999 | Forbes et al. |
| 5,909,630 A | 6/1999 | Roberts et al. |
| 5,917,745 A | 6/1999 | Fujii |
| 5,917,749 A | 6/1999 | Chen et al. |
| 5,956,267 A | 9/1999 | Hurst et al. |
| 5,963,469 A | 10/1999 | Forbes |
| 5,963,803 A | 10/1999 | Dawson et al. |
| 5,977,579 A | 11/1999 | Noble |
| 5,981,318 A | 11/1999 | Blanchard |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,008,106 A | 12/1999 | Tu et al. |
| 6,010,946 A | 1/2000 | Hisamune et al. |
| 6,042,998 A | 3/2000 | Brueck et al. |
| 6,049,106 A | 4/2000 | Forbes |
| 6,057,573 A | 5/2000 | Kirsch et al. |
| 6,063,688 A | 5/2000 | Doyle et al. |
| 6,066,191 A | 5/2000 | Tanaka et al. |
| 6,066,869 A | 5/2000 | Noble et al. |
| 6,071,789 A | 6/2000 | Yang et al. |
| 6,072,209 A | 6/2000 | Noble et al. |
| 6,077,745 A | 6/2000 | Burns et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakakima et al. |
| 6,121,148 A | 9/2000 | Bashir et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,150,688 A | 11/2000 | Maeda et al. |
| 6,157,064 A | 12/2000 | Huang |
| 6,165,833 A | 12/2000 | Parekh et al. |
| 6,172,391 B1 | 1/2001 | Goebel et al. |
| 6,174,780 B1 | 1/2001 | Robinson |
| 6,175,146 B1 | 1/2001 | Lane et al. |
| 6,191,470 B1 | 2/2001 | Forbes et al. |
| 6,211,044 B1 | 4/2001 | Xiang et al. |
| 6,229,169 B1 | 5/2001 | Hofmann et al. |
| 6,236,590 B1 | 5/2001 | Bhattacharyya et al. |
| 6,238,976 B1 | 5/2001 | Noble et al. |
| 6,246,083 B1 | 6/2001 | Noble |
| 6,265,742 B1 | 7/2001 | Gruening et al. |
| 6,271,080 B1 | 8/2001 | Mandelman et al. |
| 6,274,905 B1 | 8/2001 | Mo |
| 6,282,113 B1 | 8/2001 | DeBrosse |
| 6,288,454 B1 | 9/2001 | Allman et al. |
| 6,291,334 B1 | 9/2001 | Somekh |
| 6,297,554 B1 | 10/2001 | Lin |
| 6,306,727 B1 | 10/2001 | Akram |
| 6,316,309 B1 | 11/2001 | Holmes et al. |
| 6,320,222 B1 | 11/2001 | Forbes et al. |
| 6,348,380 B1 | 2/2002 | Weimer et al. |
| 6,350,635 B1 | 2/2002 | Noble et al. |
| 6,355,961 B1 | 3/2002 | Forbes |
| 6,362,057 B1 | 3/2002 | Taylor, Jr. et al. |
| 6,368,950 B1 | 4/2002 | Xiang et al. |
| 6,376,317 B1 | 4/2002 | Forbes et al. |
| 6,377,070 B1 | 4/2002 | Forbes |
| 6,383,907 B1 | 5/2002 | Hasegawa et al. |
| 6,391,782 B1 | 5/2002 | Yu |

| | | |
|---|---|---|
| 6,395,613 B1 | 5/2002 | Juengling |
| 6,396,096 B1 | 5/2002 | Park et al. |
| 6,399,979 B1 | 6/2002 | Noble et al. |
| 6,403,429 B2 | 6/2002 | Noble |
| 6,404,056 B1 | 6/2002 | Kuge et al. |
| 6,413,825 B1 | 7/2002 | Forbes |
| 6,414,356 B1 | 7/2002 | Forbes et al. |
| 6,423,474 B1 | 7/2002 | Holscher |
| 6,424,001 B1 | 7/2002 | Forbes et al. |
| 6,424,561 B1 | 7/2002 | Li et al. |
| 6,440,801 B1 | 8/2002 | Furukawa et al. |
| 6,448,601 B1 | 9/2002 | Forbes et al. |
| 6,455,372 B1 | 9/2002 | Weimer |
| 6,458,662 B1 | 10/2002 | Yu |
| 6,459,119 B1 | 10/2002 | Huang et al. |
| 6,461,957 B1 | 10/2002 | Yokoyama et al. |
| 6,468,887 B2 | 10/2002 | Iwasa et al. |
| 6,475,867 B1 | 11/2002 | Hui et al. |
| 6,475,869 B1 | 11/2002 | Yu |
| 6,492,233 B2 | 12/2002 | Forbes et al. |
| 6,496,034 B2 | 12/2002 | Forbes et al. |
| 6,498,062 B2 | 12/2002 | Durcan et al. |
| 6,500,763 B2 | 12/2002 | Kim et al. |
| 6,504,201 B1 | 1/2003 | Noble et al. |
| 6,504,255 B2 | 1/2003 | Keeth |
| 6,514,884 B2 | 2/2003 | Maeda |
| 6,522,584 B1 | 2/2003 | Chen et al. |
| 6,531,727 B2 | 3/2003 | Forbes et al. |
| 6,534,243 B1 | 3/2003 | Templeton et al. |
| 6,537,870 B1 | 3/2003 | Shen |
| 6,538,916 B2 | 3/2003 | Ohsawa |
| 6,545,904 B2 | 4/2003 | Tran |
| 6,548,396 B2 | 4/2003 | Naik et al. |
| 6,551,878 B2 | 4/2003 | Clampitt et al. |
| 6,559,017 B1 | 5/2003 | Brown et al. |
| 6,559,491 B2 | 5/2003 | Forbes et al. |
| 6,566,280 B1 | 5/2003 | Meagley et al. |
| 6,566,682 B2 | 5/2003 | Forbes |
| 6,570,220 B2 | 5/2003 | Doyle et al. |
| 6,573,030 B1 | 6/2003 | Fairbairn et al. |
| 6,597,203 B2 | 7/2003 | Forbes |
| 6,602,779 B1 | 8/2003 | Li et al. |
| 6,617,060 B2 | 9/2003 | Weeks et al. |
| 6,617,651 B2 | 9/2003 | Ohsawa |
| 6,627,933 B2 | 9/2003 | Juengling |
| 6,632,741 B1 | 10/2003 | Clevenger et al. |
| 6,635,917 B2 | 10/2003 | Juengling |
| 6,638,441 B2 | 10/2003 | Chang et al. |
| 6,639,268 B2 | 10/2003 | Forbes et al. |
| 6,641,985 B2 | 11/2003 | Unno et al. |
| 6,645,806 B2 | 11/2003 | Roberts |
| 6,646,303 B2 | 11/2003 | Satoh et al. |
| 6,664,806 B2 | 12/2003 | Forbes et al. |
| 6,667,237 B1 | 12/2003 | Metzler |
| 6,669,165 B2 | 12/2003 | Burke |
| 6,670,642 B2 | 12/2003 | Takaura et al. |
| 6,673,684 B1 | 1/2004 | Huang et al. |
| 6,677,230 B2 | 1/2004 | Yokoyama et al. |
| 6,686,245 B1 | 2/2004 | Mathew et al. |
| 6,686,274 B1 | 2/2004 | Shimazu et al. |
| 6,689,695 B1 | 2/2004 | Lui et al. |
| 6,693,026 B2 | 2/2004 | Kim |
| 6,696,746 B1 | 2/2004 | Farrar et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,710,387 B2 | 3/2004 | Nakamura et al. |
| 6,710,402 B2 | 3/2004 | Harada |
| 6,723,607 B2 | 4/2004 | Nam et al. |
| 6,727,168 B2 | 4/2004 | Abbott |
| 6,734,063 B2 | 5/2004 | Willer et al. |
| 6,734,107 B2 | 5/2004 | Lai et al. |
| 6,734,482 B1 | 5/2004 | Tran et al. |
| 6,734,484 B2 | 5/2004 | Wu |
| 6,744,094 B2 | 6/2004 | Forbes |
| 6,756,284 B2 | 6/2004 | Sharma |
| 6,756,625 B2 | 6/2004 | Brown |
| 6,764,949 B2 | 7/2004 | Bonser et al. |
| 6,768,663 B2 | 7/2004 | Ogata |
| 6,773,998 B1 | 8/2004 | Fisher et al. |
| 6,777,725 B2 | 8/2004 | Willer et al. |
| 6,781,212 B1 | 8/2004 | Kao et al. |
| 6,794,699 B2 | 9/2004 | Bissey et al. |
| 6,794,710 B2 | 9/2004 | Chang et al. |
| 6,797,573 B2 | 9/2004 | Brown |
| 6,798,009 B2 | 9/2004 | Forbes et al. |
| 6,800,930 B2 | 10/2004 | Jackson et al. |
| 6,801,056 B2 | 10/2004 | Forbes |
| 6,806,137 B2 | 10/2004 | Tran et al. |
| 6,808,979 B1 | 10/2004 | Lin et al. |
| 6,811,954 B1 | 11/2004 | Fukuda |
| 6,812,092 B2 * | 11/2004 | Seitz et al. .................. 438/243 |
| 6,825,529 B2 | 11/2004 | Chidambarrao et al. |
| 6,828,580 B2 | 12/2004 | Zhang |
| 6,835,663 B2 | 12/2004 | Lipinski |
| 6,835,988 B2 | 12/2004 | Yamashita |
| 6,844,591 B1 | 1/2005 | Tran |
| 6,844,594 B2 | 1/2005 | Juengling |
| 6,846,618 B2 | 1/2005 | Hsu et al. |
| 6,867,116 B1 | 3/2005 | Chung |
| 6,875,703 B1 | 4/2005 | Furukawa et al. |
| 6,881,627 B2 | 4/2005 | Forbes et al. |
| 6,882,006 B2 | 4/2005 | Maeda et al. |
| 6,888,187 B2 | 5/2005 | Brown et al. |
| 6,888,755 B2 | 5/2005 | Harari |
| 6,890,812 B2 | 5/2005 | Forbes et al. |
| 6,890,858 B2 | 5/2005 | Juengling et al. |
| 6,893,972 B2 | 5/2005 | Rottstegge et al. |
| 6,894,354 B2 | 5/2005 | Jono et al. |
| 6,900,521 B2 | 5/2005 | Forbes et al. |
| 6,905,628 B2 | 6/2005 | Bjarnason et al. |
| 6,924,191 B2 | 8/2005 | Liu et al. |
| 6,926,843 B2 | 8/2005 | Cantell et al. |
| 6,936,507 B2 | 8/2005 | Tang et al. |
| 6,939,808 B2 | 9/2005 | Tzou et al. |
| 6,946,709 B2 | 9/2005 | Yang |
| 6,951,709 B2 | 10/2005 | Li |
| 6,955,961 B1 | 10/2005 | Chung |
| 6,960,510 B2 | 11/2005 | Deshpande et al. |
| 6,960,832 B2 | 11/2005 | Shimazu et al. |
| 6,962,867 B2 | 11/2005 | Jackson et al. |
| 6,964,391 B2 | 11/2005 | Hiraguchi |
| 6,964,895 B2 | 11/2005 | Hsu |
| 6,967,140 B2 | 11/2005 | Doyle |
| 6,998,319 B2 | 2/2006 | Tanaka |
| 7,005,240 B2 | 2/2006 | Manger et al. |
| 7,012,024 B2 | 3/2006 | Abbott |
| 7,015,124 B1 | 3/2006 | Fisher et al. |
| 7,034,336 B2 * | 4/2006 | Willer ........................ 257/60 |
| 7,042,047 B2 | 5/2006 | Eppich |
| 7,045,859 B2 | 5/2006 | Amali et al. |
| 7,049,702 B2 | 5/2006 | Tseng |
| 7,056,786 B2 | 6/2006 | Yun et al. |
| 7,071,043 B2 | 7/2006 | Tang et al. |
| 7,078,296 B2 | 7/2006 | Chau et al. |
| 7,091,566 B2 * | 8/2006 | Zhu et al. ................. 257/401 |
| 7,098,105 B2 | 8/2006 | Juengling |
| 7,098,536 B2 | 8/2006 | Yang et al. |
| 7,105,089 B2 | 9/2006 | Fanselow et al. |
| 7,109,544 B2 | 9/2006 | Schloesser et al. |
| 7,112,483 B2 | 9/2006 | Lin et al. |
| 7,112,815 B2 | 9/2006 | Prall |
| 7,115,525 B2 | 10/2006 | Abatchev et al. |
| 7,118,960 B2 | 10/2006 | Tran |
| 7,119,020 B2 | 10/2006 | Okamura et al. |
| 7,122,425 B2 | 10/2006 | Chance et al. |
| 7,151,040 B2 | 12/2006 | Tran et al. |
| 7,151,690 B2 | 12/2006 | Forbes |
| 7,153,734 B2 | 12/2006 | Brask et al. |
| 7,176,109 B2 | 2/2007 | Ping et al. |
| 7,176,125 B2 | 2/2007 | Liaw |
| 7,182,823 B2 | 2/2007 | Mandigo et al. |
| 7,183,164 B2 | 2/2007 | Haller |
| 7,183,205 B2 | 2/2007 | Hong |
| 7,183,597 B2 | 2/2007 | Doyle |
| 7,199,419 B2 | 4/2007 | Haller |
| 7,205,192 B2 | 4/2007 | Kweon |
| 7,205,598 B2 | 4/2007 | Voshell et al. |

| | | |
|---|---|---|
| 7,208,379 B2 | 4/2007 | Venugopal et al. |
| 7,214,629 B1 | 5/2007 | Luo et al. |
| 7,226,853 B2 | 6/2007 | Bekiaris et al. |
| 7,238,580 B2 | 7/2007 | Orlowski et al. |
| 7,253,118 B2 | 8/2007 | Tran et al. |
| 7,262,089 B2 | 8/2007 | Abbott et al. |
| 7,268,054 B2 | 9/2007 | Tran et al. |
| 7,271,107 B2 | 9/2007 | Marks et al. |
| 7,285,812 B2 | 10/2007 | Tang et al. |
| 7,371,627 B1 | 5/2008 | Forbes |
| 7,372,091 B2 | 5/2008 | Leslie |
| 7,384,868 B2 | 6/2008 | Cabral et al. |
| 7,390,746 B2 | 6/2008 | Bai et al. |
| 7,393,789 B2 | 7/2008 | Abatchev et al. |
| 7,396,767 B2 | 7/2008 | Wu et al. |
| 7,396,781 B2 | 7/2008 | Wells |
| 7,413,981 B2 | 8/2008 | Tang et al. |
| 7,510,954 B1 | 3/2009 | Forbes |
| 7,525,141 B1 | 4/2009 | Forbes |
| 7,838,360 B2 | 11/2010 | Forbes |
| 2001/0005631 A1 | 6/2001 | Kim et al. |
| 2001/0019870 A1 | 9/2001 | Noble |
| 2002/0000608 A1 | 1/2002 | Harada |
| 2002/0005590 A1 | 1/2002 | Keeth |
| 2002/0024081 A1 | 2/2002 | Gratz |
| 2002/0028541 A1 | 3/2002 | Lee et al. |
| 2002/0030214 A1 | 3/2002 | Horiguchi |
| 2002/0038886 A1 | 4/2002 | Mo |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0061639 A1 | 5/2002 | Itonaga |
| 2002/0063110 A1 | 5/2002 | Cantell et al. |
| 2002/0121673 A1 | 9/2002 | Jono et al. |
| 2002/0123216 A1 | 9/2002 | Yokoyama et al. |
| 2002/0127810 A1 | 9/2002 | Nakamura |
| 2002/0130348 A1 | 9/2002 | Tran |
| 2002/0130686 A1 | 9/2002 | Forbes |
| 2002/0135004 A1* | 9/2002 | Uh et al. ............ 257/296 |
| 2002/0135029 A1 | 9/2002 | Ping et al. |
| 2002/0158273 A1 | 10/2002 | Satoh et al. |
| 2002/0182847 A1 | 12/2002 | Yokoyama et al. |
| 2002/0187356 A1 | 12/2002 | Linthicum et al. |
| 2003/0001290 A1 | 1/2003 | Nitayama et al. |
| 2003/0006410 A1 | 1/2003 | Doyle |
| 2003/0008461 A1 | 1/2003 | Forbes et al. |
| 2003/0015757 A1 | 1/2003 | Ohsawa |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0077855 A1 | 4/2003 | Abbott |
| 2003/0085422 A1 | 5/2003 | Amali et al. |
| 2003/0119307 A1 | 6/2003 | Bekiaris et al. |
| 2003/0127426 A1 | 7/2003 | Chang et al. |
| 2003/0132480 A1 | 7/2003 | Chau et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0218199 A1 | 11/2003 | Forbes et al. |
| 2003/0227072 A1 | 12/2003 | Forbes et al. |
| 2003/0230234 A1 | 12/2003 | Nam et al. |
| 2003/0234414 A1 | 12/2003 | Brown |
| 2004/0000534 A1 | 1/2004 | Lipinski |
| 2004/0002203 A1 | 1/2004 | Deshpande et al. |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0070007 A1 | 4/2004 | Zhang |
| 2004/0079456 A1 | 4/2004 | Mandigo et al. |
| 2004/0079988 A1 | 4/2004 | Harari |
| 2004/0094786 A1 | 5/2004 | Tran et al. |
| 2004/0105330 A1 | 6/2004 | Juengling |
| 2004/0106257 A1 | 6/2004 | Okamura et al. |
| 2004/0150111 A1 | 8/2004 | Shimazu et al. |
| 2004/0195613 A1 | 10/2004 | Kweon |
| 2004/0197989 A1 | 10/2004 | Sommer et al. |
| 2004/0217391 A1 | 11/2004 | Forbes |
| 2004/0235255 A1 | 11/2004 | Tanaka et al. |
| 2005/0001232 A1 | 1/2005 | Bhattacharyya |
| 2005/0017156 A1 | 1/2005 | Ehrmann et al. |
| 2005/0037584 A1 | 2/2005 | Abbott |
| 2005/0045965 A1 | 3/2005 | Lin et al. |
| 2005/0046048 A1 | 3/2005 | Yun et al. |
| 2005/0048714 A1 | 3/2005 | Noble |
| 2005/0059242 A1 | 3/2005 | Cabral et al. |
| 2005/0074949 A1 | 4/2005 | Jung et al. |
| 2005/0079721 A1 | 4/2005 | Buerger et al. |
| 2005/0104090 A1 | 5/2005 | Juengling |
| 2005/0145913 A1 | 7/2005 | Katsumata et al. |
| 2007/0049040 A1 | 3/2007 | Bai et al. |

FOREIGN PATENT DOCUMENTS

| | | |
|---|---|---|
| JP | 60167349 A2 | 8/1985 |
| JP | 1100948 A2 | 4/1989 |
| JP | 2219253 A2 | 8/1990 |
| JP | 4130630 A2 | 5/1992 |
| JP | 4162528 A2 | 6/1992 |

OTHER PUBLICATIONS

"Quantum Confinement Effects in a 3D FinFET Transistor,", http://www.ise.com/appex/FinFET/FinFET.html, Jan. 15, 2003, 5 pages.

Ahn, S.J. et al., Highly Scalable and CMOS-Compatible STTM Cell Technology, , IEEE International Electron Devices Meeting 2003, 2003, pp. 10.4.1-10.4.4, Piscataway, NJ, USA.

Ahn, S.J. et al., "Examination and Improvement of Reading Disturb Characteristics of a Surrounded Gate STTM Memory Cell,", 2003 Third IEEE Conference on Nanotechnology, IEEE-NANO 2003. Proceedings (Cat. No. 03TH8700), 2003, vol. 2, pp. 528-530, Piscataway, NJ, USA.

Cho, Hyun-Jin et al., "A Novel Pillar DRAM Cell 4 Gbit and Beyond,", Digest of Technical Papers Symposium on VLSI Technology, Jun. 1, 1998, pp. 38-39.

Cho, Hyun-Jin et al., "High Performance Fully and Partially Depleted Poly-Si Surrounding Gate Transistors,", 1999 Symposium on VLSI Technology Digest of Technical Papers (IEEE Cat. No. 99CH36325), 1999, pp. 31-32, Tokyo, Japan.

Clarke, Peter, "ISSCC: Vertical Transistor Structures Considered", EE Times Website, http://www.eetimes.com, Feb. 1, 2000, 3 pages.

Date, C.K. et al., "Suppression of the Floating-Body Effect Using SiGe Layers in Vertical Surrounding-Gate MOSFETs,", IEEE Transactions on Electron Devices, Dec. 1, 2001, vol. 48, Issue 12, pp. 2684-2689.

De, Indranil et al., "Impact of Gate Workfunction on Device Performance at the 50 nm Technology Node,", Solid-State Electronics, Jun. 1, 2000, vol. 44, Issue 6, pp. 1077-1080.

Denton, Jack P. et al., "Fully Depleted Dual-Gate Thin-Film SOI P-MOSFET's Fabricated in SOI Islands With an Isolated Buried Polysilicon Backgate,", IEEE Electron Device Letters, Nov. 1, 1996, vol. 17, Issue 11, pp. 509-511.

Doyle, B. et al., "Tri-Gate Fully-Depleted CMOS Transistors: Fabrication, Design and Layout,", 2003 Symposium on VLSI Technology, Digest of Technical Papers, 2003, pp. 133-134, Tokyo, Japan.

Doyle, B.S. et al., "High Performance Fully-Depleted Tri-Gate CMOS Transistors,", IEEE Electron Device Letters, Apr. 1, 2003, vol. 24, Issue 4.

Endoh T. et al., "Floating Channel Type SGT Flash Memory,", Transactions of the Institute of Electronics, Information and Communication Engineers C-I, Mar. 1, 1999, vol. J82-C, Issue 3, pp. 134-135.

Endoh T. et al., "The 1.44F2 Memory Cell Technology With the Stacked-Surrounding Gate Transistor (S-SGT) DRAM,", Proceedings 22nd International Conference on Microelectronics, May 14-17, 2000, vol. 2, pp. 451-454.

Endoh, Testuo et al., "Analysis of High Speed Operation for Multi-SGT,", Transactions of the Institute of Electronics, Information and Communication Engineers C-I, Aug. 1, 1997, vol. J80C-I, Issue 8, pp. 382-383.

Endoh, Tetsuo et al., "A High Signal Swing Pass-Transistor Logic Using Surrounding Gate Transistor,", Simulation of Semiconductor Processes and Devices, 2000, SISPAD 2000, 2000 International Conference, Sep. 6-8, 2000, pp. 273-275.

Endoh, Tetsuo et al., "Novel Ultra High Density Flash Memory With a Stacked-Surrounding Gate Transistor (S-SGT) Structured Cell,", IEEE Transactions on Electron Devices, Apr. 2003, vol. 50, Issue 4, pp. 945-951.

Endoh, Tetsuo et al., "Novel Ultra High Density Flash Memory With a Stacked-Surrounding Gate Transistor (S-SGT) Structured Cell,", International Electron Devices Meeting, Technical Digest IEEE, 2001, pp. 2.3.1-2.3.4.

Endoh, Tetsuo et al., "The Analysis of the Stacked-Surrounding Gate Transistor (S-Sgt) DRAM for the High Speed and Low Voltage Operation,", IEICE Transactions on Electronics, Sep. 1, 1998, vol. E81-C, Issue 9, pp. 1491-1498.

Endoh, Tetsuo et al., "The Stacked-SGT DRAM Using 3d-Building Memory Array Technology,", Transactions of the Institute of Electronics, Information and Communication Engineers C-I, May 1998, vol. J81CI, Issue 5, pp. 288-289.

Endoh, Tetsuo et al., "An Accurate Model of Fully-Depleted Surrounding Gate Transistor (FD-SGT),", IEICE Transactions on Electronics, Jul. 1, 1997, vol. E80-C, Issue 7, pp. 905-910.

Endoh, Tetsuo et al., "An Analytic Steady-State Current-Voltage Characteristic of Short Channel Fully-Depleted Surrounding Gate Transistor (FD-SGT),", IEICE Transactions on Electronics, Jul. 1, 1997, vol. E80-C, Issue 7, pp. 911-917.

Endoh, Tetsuo et al., "The 2.4F2 Memory Cell Technology With Stacked-Surrounding Gate Transistor (S-Sgt) Dram,", IEEE Transactions of the Institute of Electronics, Aug. 1, 2001, vol. 48, Issue 8, pp. 1599-1603.

Forbes, "DRAM Array with Surrounding Gate Access Transistors and Capacitors Over Global Bit Lines,", Surroundingdisc4.doc, Sep. 14, 2004.

Goebel, B. et al., "Fully Depleted Surrounding Gate Transistor (SGT) for 70 nm DRAM and Beyond,", IEEE, 2002, pp. 5.

Hioki, Masakazu et al., "An Analysis of Program and Erase Operation for FC-SGT Flash Memory Cells,", Simulation of Semiconductor Processes and Devices, 2000, SISPAD 2000, 2000 International Conference, 2000, pp. 116-118.

Huang, Xuejue et al., "Sub-50 nm P-Channel FinFET,", IEEE Transactions on Electron DevicesIEEE Transactions on Electron DevicesIEEE Transactions on Electron Devices, May 2001, vol. 48, Issue 5.

Iwai, Makoto et al., "Buried Gate Type SGT Flash Memory,", Transactions of the Institute of Electronics, Information and Communication Engineers C, May 2003, vol. J86-C, Issue 5, pp. 562-564.

Kalavade, Pranav et al., "A Novel Sub-10nm Transistor,", IEEE Device Research Conf., Jun. 2000, pp. 71-72, Denver, CO.

Kedzierski, Jakub et al., "High-Performance Symmetric-Gate and CMOS-Compatible Vt Asymmetric-Gate FinFET Devices,", IEDM, 2001, vol. 19.5, pp. 4.

Kim, K. et al., "Nanoscale CMOS Circuit Leakage Power Reduction by Double Gate Device,", International Symposium on Low Power Electronics and Design, 2004, pp. 102-107, Newport, California.

Kranti, A. et al., "Optimisation for Improved Short-Channel Performance of Surrounding/Cylindrical Gate MOSFETs,", Electronics Letter, Apr. 2001, vol. 37, Issue 8, pp. 533-534.

Kranti, Abhinav et al., "An Analytical Temperature Dependent Threshold Voltage Model for Thin Film Surrounded Gate SOI MOSFET,", Proceedings of the SPIE—The International Society for Optical Engineering, 2000, vol. 3975, pp. 605-608.

Lau et al., "High Aspect Ration Submicron Silicon Pillars Fabricated by Photoassisted electrochemical Etching and Oxidation,", Applied Physics Letters, Sep. 25, 1995, vol. 67, Issue 13, pp. 1877-1879.

Lau et al., "High Aspect Ration Submicron Silicon Pillars for Light Emission Studies and Photonic Band Gap Material Application,", 1995/6 Research Journal, Microelectric Group, Jun. 1, 1996, 3 pages.

Lutze et al., "Field Oxide Thinning in Poly Buffer LOCOS Isolation With j Active Area Spacings to 0.1um,", Journal of Electrochemical Society, Jun. 1, 1990, vol. 137, Issue 6, pp. 1867-1870.

Mandelman et al., "Challenges and Future Directions for the Scaling of Dynamic Random-Access Memory (DRAM),", IBM J. Res. & Dev, Mar./May 2002, vol. 46, Issue 2-3, pp. 187-212.

Matsuoka, F. et al., "Numerical Analysis of Alpha-Particle-Induced Soft Errors in Floating Channel Type Surrounding Gate Transistor (FC-SGT) DRAM Cell,", Electron—Devices IEEE Transactions on, Jul. 2003, vol. 50, Issue 7, pp. 1638-1644.

Matsuoka, Fumiyoshi et al., "A Study of Soft Error in SGT DRAM,", Record of Electrical and Communication Engineering Conversazione Tohoku University, Oct. 1, 2002, vol. 71, Issue 1, pp. 469-470 Journal Paper.

Miyamoto, Shoichi et al., "Effect of LDD Structure and Channel Poly-Si Thinning on a Gate-All-Around TFT (GAT) for SRAM's,", IEEE Transactions on Electron Devices, Aug. 1999, vol. 46, Issue 8, pp. 19693-19698.

Miyano, Shinji, et al., "Numerical Analysis of a Cylindrical Thin-Pillar Transistor (CYNTHIA),", IEEE Transactions on Electron Devices, Aug. 1992, vol. 39, Issue 8, pp. 1876-1881.

Nakamura, Tairiku, "A Study of Steady-State Characteristics of Sgt Type Three-Dimensional MOS Transistor,", Record of Electrical and Communication Engineering Conversazione Tohoku University, Jan. 1, 1998, vol. 66, Issue 1, pp. 211-212.

Nishi, Ryohsuki et al., "Analysis of the Shape of Diffusion Layer of Sgt for Suppressing Substrate Bias Effect,", Transactions of the Institute of Electronics, Information and Communication Engineers C, Oct. 1, 2001, vol. J84-C, Issue 10, pp. 1018-1020.

Nishi, Ryohsuki, et al., "Concave Source SGT for Suppressing Punch-Through Effect,", Transactions of the Institute of Electronics, Information and Communication Engineers C, Feb. 1, 2003, vol. J86-C, Issue 2, pp. 200-201.

Nitayama, A. et al., "High Speed and Compact CMOS Circuits With Multi-Pillar Surrounding Gate Transistors,", IEEE Transactions on Electron Devices, Nov. 1, 1989, vol. 36, Issue 11, pp. 2605-2606.

Nitayama, Akihiro, "Multi-Pillar Surrounding Gate Transistor (M-SGT) for Compact and High-Speed Circuits,", IEEE Transactions on Electron Devices, Mar. 1, 1991, vol. 28, Issue 3, pp. 579-583.

Sakai, Takeshi et al., "A Study of Stacked-SGT-Based Pass-Transistor Logic Circuit,", Record of Electrical and Communication Engineering Conversazione Tohoku University, Feb. 1, 2004, vol. 72, Issue 2, pp. 108-109.

Sakamoto, Wataru et al., "A Study of Current Drivability of SGT,", Record of Electrical and Communication Engineering Conversazione Tohoku University, Feb. 1, 2004, vol. 72, Issue 2, pp. 110-111.

Seeger et al., Fabricaton of Ordered Arrays of Silicon Nanopillars, , J.Phys. D: Appl Phys, 1999, vol. 32, pp. L129-L132.

Sunouchi, K. et al., "A Surrounding Gate Transistor (SGT) Cell for 64/256 Mbit DRAMs,", International Electron Devices Meeting 1989, Technical Digest (Cat. No. 89CH2637-7), Dec. 1989, pp. 23-26, New York, NY, USA.

Suzuki, Masahiko, "The 2.4F2 Memory Cell Technology with Stacked-Surrounding Gate Transistor (S-SGT) DRAM,", Transactions of the Institute of Electronics, C, Jan. 1, 2000, vol. J83-C, Issue 1, pp. 92-94, Japan.

Takato, H. et al., "Impact of Surrounding Gate Transistor (SGT) for Ultra-High Density LSI's,", IEEE Transactions on Electron Devices, Mar. 1, 1991, vol. 38, Issue 3, pp. 573-578.

Takato, H. et al., "High Performance CMOS Surrounding Gate Transistor (SGT) for Ultra High Density LSIs,", IEEE Electron Devices Meeting, Technical Digest, 1988, pp. 222-225.

Terauchi, M et al., "A Surrounding Gate Transistor (SGT) Gain Cell for Ultra High Density DRAMs,", 1993 Symposium on VLSI Technology, Digest of Technical Papers (IEEE Cat. No. 93CH 3303-5), 1993, pp. 21-22, Tokyo, Japan.

Terauchi, Mamoru et al., "Depletion Isolation Effect of Surrounding Gate Transistors,", IEEE Transactions on, Dec. 1, 1997, vol. 44, Issue 12, pp. 2303-2305.

Watanabe, Shigeyoshi et al., ,"A Novel Circuit Technology With Surrounding Gate Transistors (SGT's) for Ultra High Density DRAM's,", IEEE Journal of Solid-State Circuits, Sep. 1, 1995, vol. 30, Issue 9, pp. 960-971.

Watanabe, Shigeyoshi, "Impact of Three-Dimensional Transistor on the Pattern Area Reduction for ULSI,", IEEE Transaction on Electron Devices, Oct. 1, 2003, vol. 50, Issue 10, pp. 2073-2080.

Wolf et al., "Silicon Processing for the VLSI Era", Lattice Press, 1986, vol. 1, pp. 529-555, USA.

Wong, Hon-Sum P., et al., "Self-Aligned (Top and Bottom) Double-Gate MOSFET With a 25nm Thick Silicon Channel,", IEEE Int. Electron Device Meeting, 1997, pp. 427-430.

Xuan, Pieqi et al. "60nm Planarized Ultra-Thin Body Solid Phase Epitaxy MOSFETs,", IEEE Device Research Conf., Jun. 1, 2000, pp. 67-68, Denver, CO.

Yamashita, Hiroomi et al., "A Study of Process Design in Three Dimensional Sgt Device,", Record of Electrical and Communication Engineering Conversazione Tohoku University, Oct. 1, 2002, vol. 71, Issue 1, pp. 467-468.

Zhang, Wei et al., "A study of Load Capacitance in SGT, ", Record of Electrical and Communication Engineering Conversazione Tohoku University, Oct. 2002, vol. 71, Issue 1, pp. 473-474.

* cited by examiner

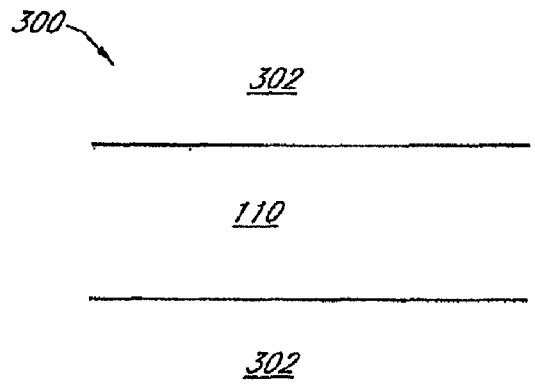
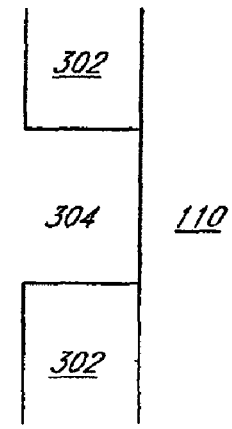
FIG. 15A          FIG. 15B
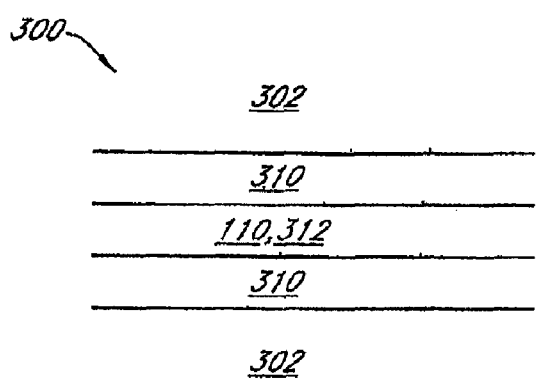
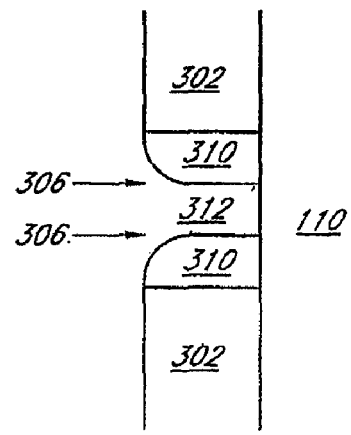
FIG. 16A          FIG. 16B

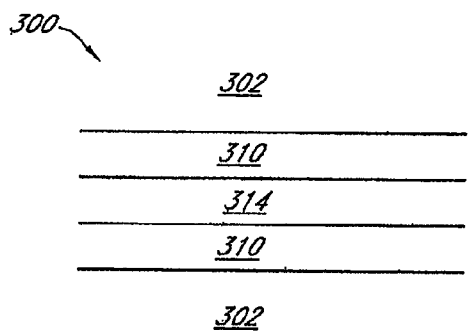 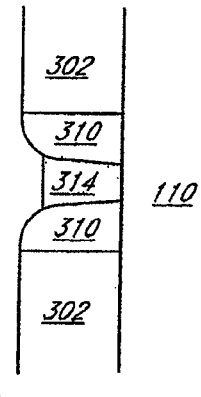
FIG. 17A          FIG. 17B
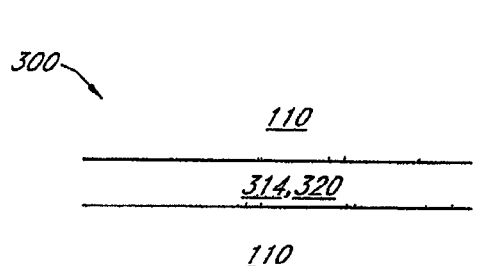 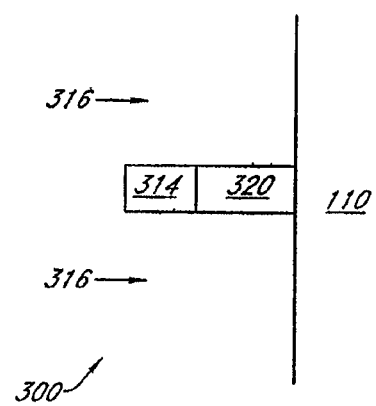
FIG. 18A          FIG. 18B

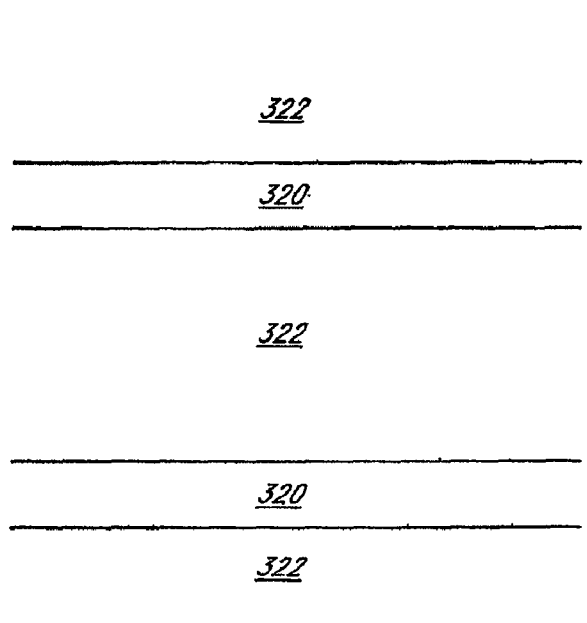 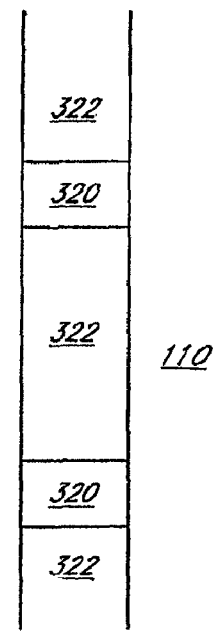
FIG. 19A  FIG. 19B
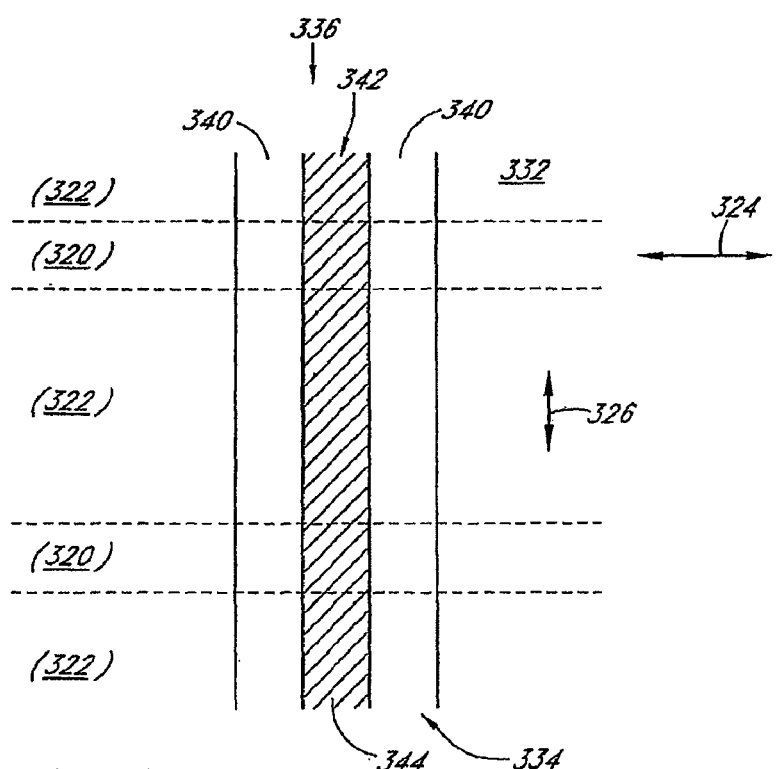
FIG. 20

MEMORY ARRAY WITH SURROUNDING GATE ACCESS TRANSISTORS AND CAPACITORS WITH GLOBAL AND STAGGERED LOCAL BIT LINES

CROSS-REFERENCE TO RELATED APPLICATIONS

This application is a continuation of U.S. patent application Ser. No. 12/394,711, filed Feb. 27, 2009, now U.S. Pat. No. 7,838,360, which is a continuation of U.S. patent application Ser. No. 11/462,617, filed Aug. 4, 2006, now U.S. Pat. No. 7,510,954, which is a divisional application of U.S. patent application Ser. No. 11/128,585, filed May 13, 2005, now U.S. Pat. No. 7,120,046, the entireties of which are hereby incorporated by reference.

BACKGROUND OF THE INVENTION

1. Field of the Invention

The invention relates to the field of high density semiconductor memory arrays and more particularly to arrays with vertical transistors having sub-photolithographic device dimensions with ultra-thin pillars and substantially fully surrounding gates suitable for use as access transistors, such as for DRAM arrays. The arrays include additional room for access transistors and have high density local bit/data lines as well as low resistance global bit/data lines.

2. Description of the Related Art

Ongoing scaling of metal oxide semiconductor field effect transistor (MOSFET) technology to the deep sub-micron region where channel lengths are less than 0.1 micron (100 nanometers or 1,000 Å) causes significant problems in conventional transistor structures. Generally, junction depth should be much less than the channel length, and thus for a channel length of, for example 1,000 Å, this implies junction depths on the order of a few hundred Angstroms. Such shallow junctions are difficult to form by conventional implantation and diffusion techniques.

FIG. 1 illustrates general trends and relationships for a variety of device parameters with scaling by a factor k. As another example, with an aggressive scaling factor, extremely high levels of channel doping are required to suppress undesirable short channel effects, such as drain induced barrier lowering (DIBL), threshold voltage roll off, and sub-threshold conduction. Sub-threshold conduction is particularly problematic in dynamic random access memory (DRAM), as it significantly reduces the charge storage retention time of the capacitor cells. Extremely high doping level generally results in increased leakage and reduced carrier mobility, thus making the channel shorter to improve performance, is offset or negated by the lower carrier mobility and higher leakage. This leakage current is a significant concern and problem in low voltage and low power battery operated complimentary metal oxide semiconductor (CMOS) circuits and systems, particularly in DRAMs.

This is shown in FIG. 2 that if low voltages are used for this low power operation, then there is a problem with threshold voltages and standby leakage current being of large enough value to degrade overall circuit performance. For example, to achieve significant overdrive and reasonable system switching speeds, the threshold voltage magnitudes are desirably small, in this example near 0 volts, however the transistor, such as an access transistor, will always have a large sub-threshold leakage current. Various technologies have been employed to allow low voltage operation with deep sub-micron CMOS transistors that can have relatively large variations in threshold voltage, yet still have relatively low sub-threshold leakage currents at standby.

For example, one technique used in scaling down transistors is referred to as dual-gated or double-gated transistor structures. The terminology generally employed in the industry is "dual-gate" if the transistor has a front gate and a back gate which can be driven with separate and independent voltages and "double-gated" to describe structures where both gates are driven with the same potential. In certain aspects, a dual-gated and/or double-gated MOSFET offers better device characteristics than conventional bulk silicon MOSFETs. Because a gate electrode is present on both sides of the channel, rather than only on one side as in conventional planar MOSFETs, the electrical field generated by the drain electrode is better screened from the source end of the channel than in conventional planar MOSFETs, as illustrated schematically by the field lines in FIG. 3.

This can result in an improved sub-threshold leakage current characteristic, as illustrated schematically in FIG. 4. The dual-gate and/or double-gate MOSFET turns off and the sub-threshold current is reduced more quickly as the gate voltage is reduced. However, even though dual gate and/or double gate structures offer advantages over conventional bulk silicon MOSFETs, there remains a desire for continued improvement in device performance with continued aggressive scaling. More particularly, there is a need to provide lower resistance data/bit lines in high density arrays. There is also a need for increased room to fabricate sense amplifiers for higher density arrays.

SUMMARY OF THE INVENTION

The above referenced needs are satisfied by the invention which in one embodiment comprises a memory access array comprising a semiconductive substrate, a plurality of local data/bit lines extending generally in a first direction and formed in an upper, surface of the substrate at a first pitch, a plurality of access transistors extending generally upward from the upper surface of the substrate and aligned generally atop a corresponding local data/bit line, wherein the access transistors comprise a pillar extending generally upward from the upper surface of the substrate and generally aligned atop the corresponding local data/bit line wherein a source region is formed generally at a lower portion of the pillar so as to be in electrical communication with the corresponding local data/bit line and a drain region is formed generally at an upper portion of the pillar with a capacitor contact surface defined at an upper surface of the pillar and a surround gate structure substantially completely encompassing the pillar in lateral directions and extending substantially the entire vertical extent of the pillar, a plurality of conductive word lines extending generally in a second direction and formed at a second pitch and in electrical contact with a corresponding surround gate structure at least a first surface thereof such that bias voltage applied to a given word line is communicated substantially uniformly in a lateral extent about the corresponding pillar via the surround gate structure and wherein the cell access transistors are arranged in a plurality of columns generally along the second direction, and a plurality of global data/bit lines extending generally in the first direction, wherein the access transistors in at least one column are interconnected between corresponding global data/bit lines and local data/bit lines so as to define local data/bit access transistors between the corresponding global data/bit lines and local data/bit lines and such that remaining columns of access transistors define cell access transistors.

Another embodiment comprises a memory array comprising an access array comprising a semiconductive substrate, a plurality of local data/bit lines extending generally in a first direction and formed in an upper surface of the substrate at a first pitch, a plurality of access transistors extending generally upward from the upper surface of the substrate and aligned generally atop a corresponding data/bit line, wherein the access transistors comprise a pillar extending generally upward from the upper surface of the substrate and generally aligned atop the corresponding data/bit line wherein a source region is formed generally at a lower portion of the pillar so as to be in electrical communication with the corresponding data/bit line and a drain region is formed generally at an upper portion of the pillar with a capacitor contact defined at upper surfaces of the pillars and a surround gate structure substantially completely encompassing the pillar in lateral directions and extending substantially the entire vertical extent of the pillar, a plurality of conductive word lines extending generally in a second direction and formed at a second pitch and in electrical contact with a corresponding surround gate structure at least a first surface thereof such that bias voltage applied to a given word line is communicated substantially uniformly in a lateral extent about the corresponding pillar via the surround gate structure and wherein the cell access transistors are arranged in a plurality of columns generally along the second direction, and a plurality of global data/bit lines extending generally in the first direction, wherein the access transistors in at least one column are interconnected between corresponding global data/bit lines and local data/bit lines so as to define local data/bit access transistors between the corresponding global data/bit lines and local data/bit lines and such that remaining columns of access transistors define cell access transistors, and local data/bit access lines in contact with the local data/bit access transistors such that appropriate potential can be applied to the local data/bit access transistors so as to turn on the local data/bit access transistors to provide conduction channels between the local data/bit lines and the global data/bit lines, and a plurality of storage capacitors interconnected via the capacitor contacts with corresponding cell access transistors so as to define memory cells in combination therewith.

Yet another embodiment comprises a method of fabricating a memory array comprising forming a plurality of local data/bit lines in a surface of a substrate, forming a mask layer on the surface of the substrate forming openings in the mask layer so as to be aligned generally with corresponding local data/bit lines, depositing sidewall material in the openings of the mask layer, directionally etching the sidewall material so as to form sidewall structures arranged against inner surfaces of the openings and defining a generally centrally arranged hole in the sidewall structures, forming a plug structure in the holes, performing a directional etch with the plug structures as masking structures so as to define a plurality of pillars extending generally vertically from the surface of the substrate and substantially conforming to the contour and position of the plug structures, forming gate structures about the pillars such that the gate structures substantially completely encompass corresponding pillars, and forming global data/bit lines extending across the pillars.

A further embodiment comprises a memory device comprising a substrate, a plurality of gate structures having a first and a second end formed on the substrate so as to extend upwards therefrom, a plurality of charge storage devices formed adjacent the second end of the plurality of gate structures so as to be electrically connected to a first set of the plurality of gate structures such that the plurality of gate structures and plurality of charge storage devices define an array of memory cells, a first set of access conductors formed in the substrate so as to electrically couple to the first set of the plurality of gate structures to thereby allow data to be transferred to and from the memory cells, a second set of access conductors formed adjacent the plurality of gate structures such that the second set of access conductors activate the gate structures to allow for conduction between the first and second ends of the gate structures, and a third set of access conductors formed adjacent the second ends of the plurality of gate structures, wherein the third set of access conductors are coupled to exposed second ends of a second set of the plurality of gate structures such that activation of the second set of gate structures results in a conductive path between the first set of access conductors and the third set of access conductor wherein data can be stored or read in one or more of the memory cells via the first set of access conductors, across the second set of gate structures and then to the third set of access conductors.

Thus, various embodiments provide a memory array including access transistors over buried local data/bit lines which include substantially surrounding gate structures which provide improved sub-threshold performance and relatively high device density. Low resistance global data/bit lines can be selectively interconnected to the local data/bit lines to provide lower resistance paths between memory cells and sense amplifiers. Certain embodiments provide the ability to fabricate relatively precisely defined device features of sub-photolithographic dimensions with increased fabrication footprints available for sense amplifier modules. Embodiments also provide word lines that contact surround gate structures for improved control of the conduction channel. These and other objects and advantages of the invention will be more apparent from the following description taken in conjunction with the accompanying drawings.

BRIEF DESCRIPTION OF THE DRAWINGS

FIGS. 11A-14A are top views and FIGS. 11B-14B are side section views respectively of one embodiment of fabricating an ultra-thin body transistor array;

FIGS. 15A-19A are top views and FIGS. 15B-19B are end section views respectively of another embodiment of fabricating an ultra-thin body transistor array;

FIG. 20 is a top view of a further fabrication step in one embodiment of fabricating an ultra-thin body transistor array;

DETAILED DESCRIPTION OF THE PREFERRED EMBODIMENT

Figure 1:
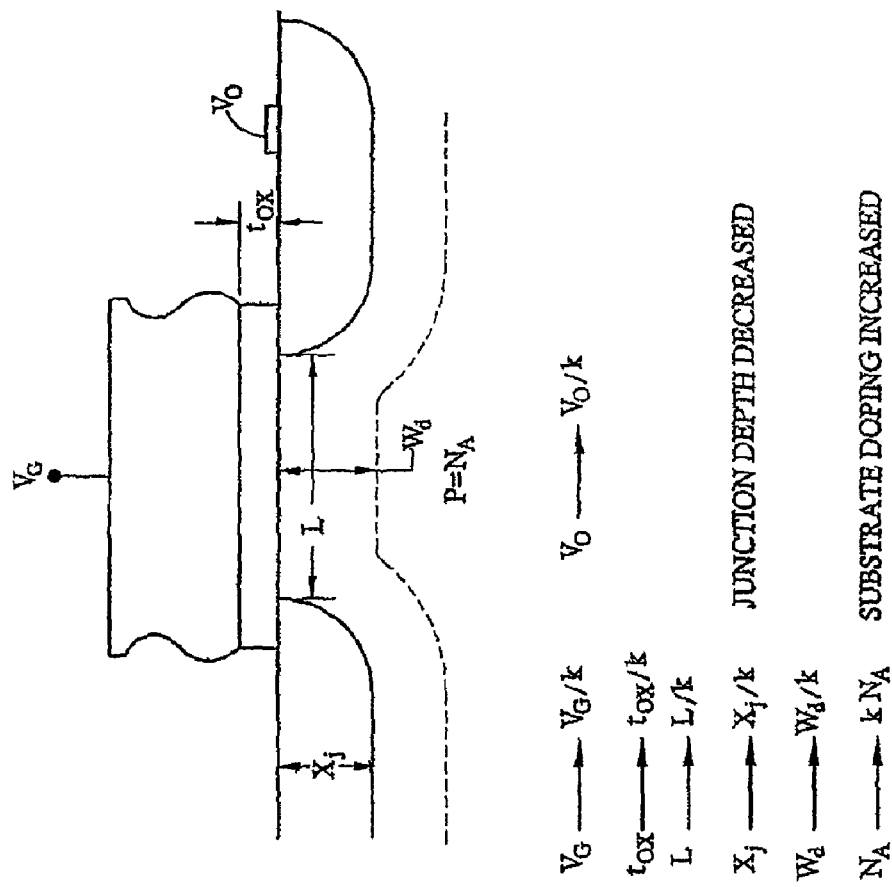
FIG. 1 is schematic illustration of general relationships of various device parameters/characteristics for a scaling factor k.
Figure 2:
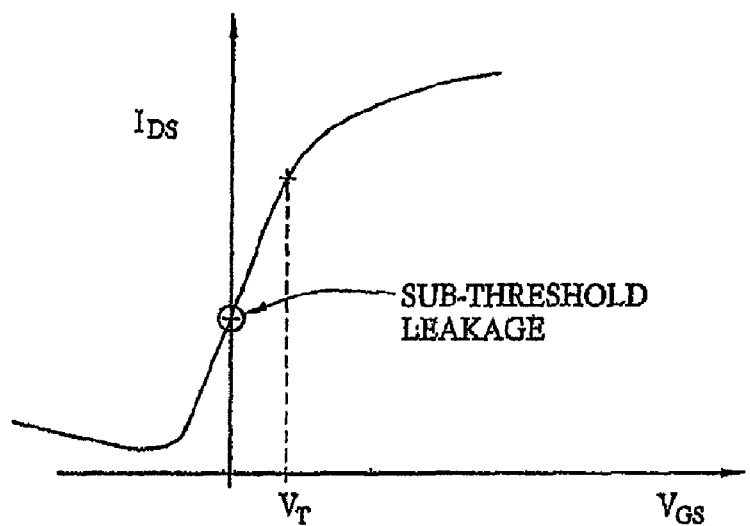
FIG. 2 is a graph illustrating sub-threshold leakage in a conventional silicon MOSFET.
Figure 3:
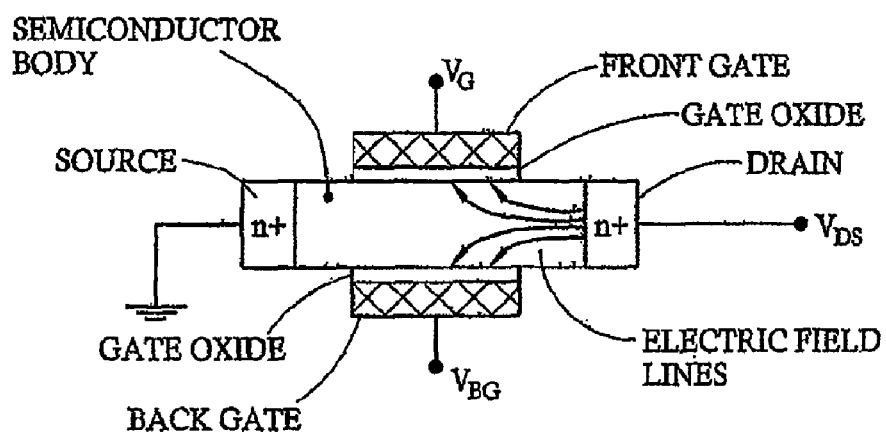
FIG. 3 is a schematic illustration of a known dual-gate MOSFET.
Figure 4:
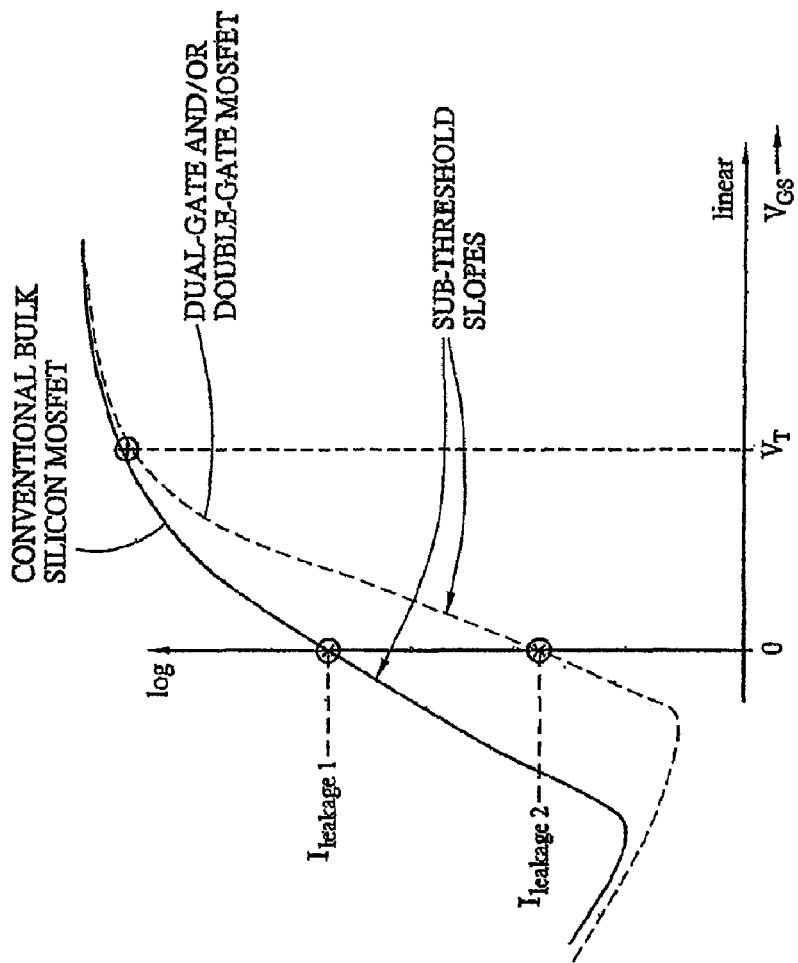
FIG. 4 is a graph illustrating sub-threshold conduction characteristics of conventional bulk silicon MOSFETs and of dual-gate and/or double gate MOSFETs.
Figure 5A:
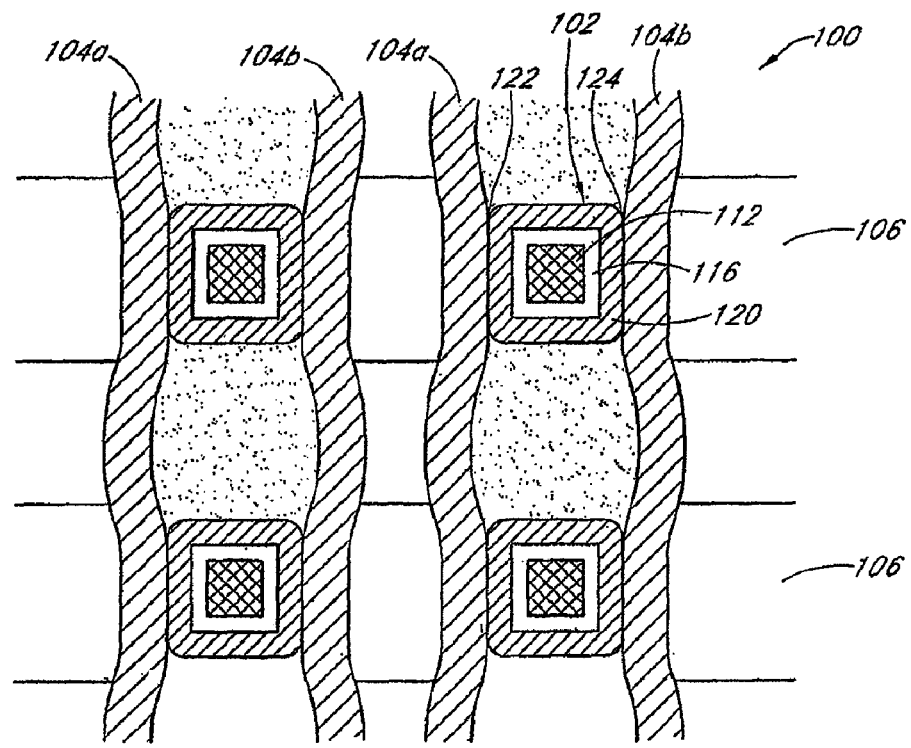
FIG. 5A is a top section view along A-A' of FIG. 5B which is a side section view of one embodiment of an array of ultra-thin etched pillar access transistors.
Figure 5B:
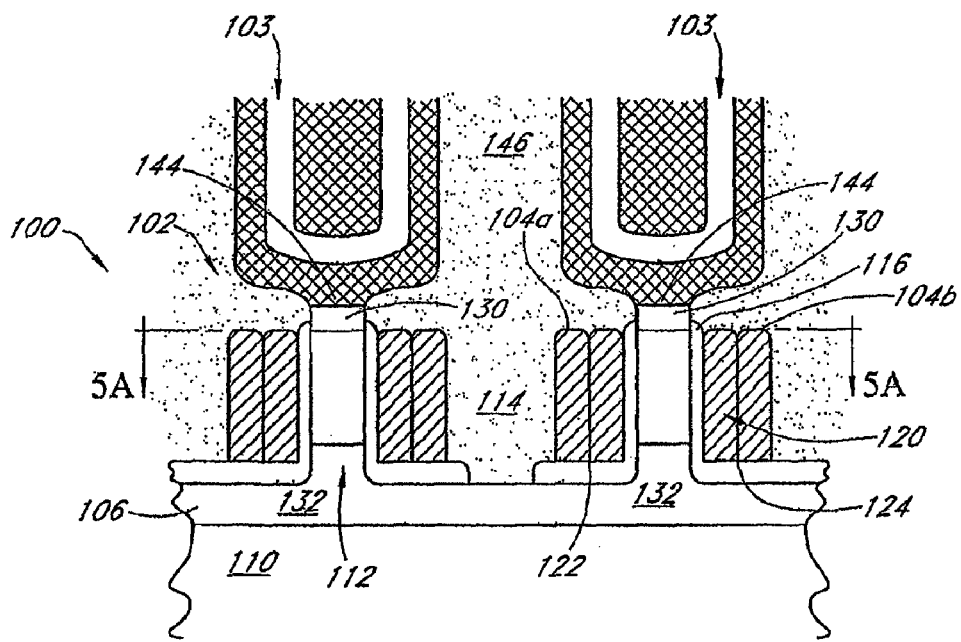
Figure 6:
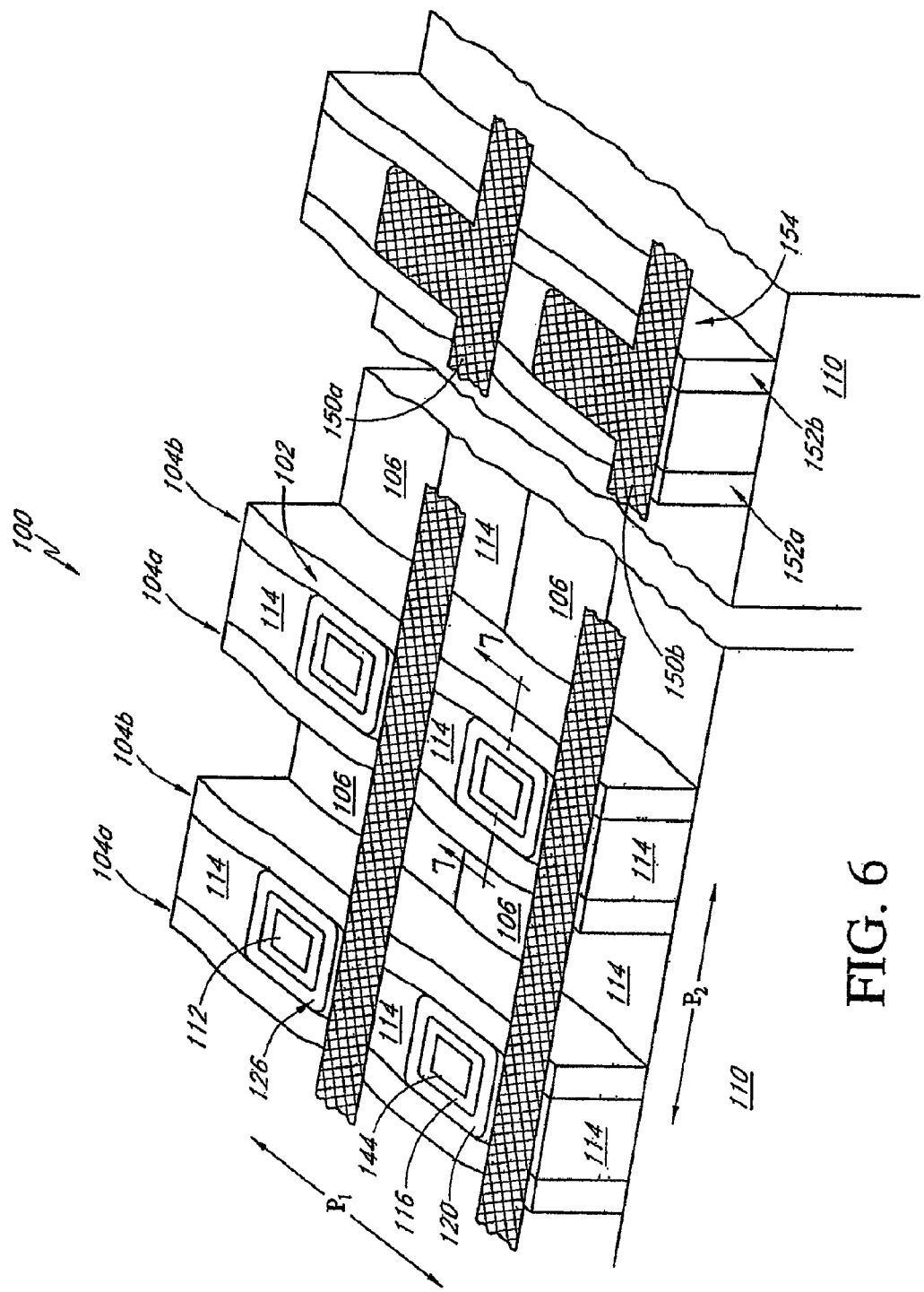
FIG. 6 is a perspective view of one further embodiment of a memory access array with local and global data/bit lines.
Figure 24:
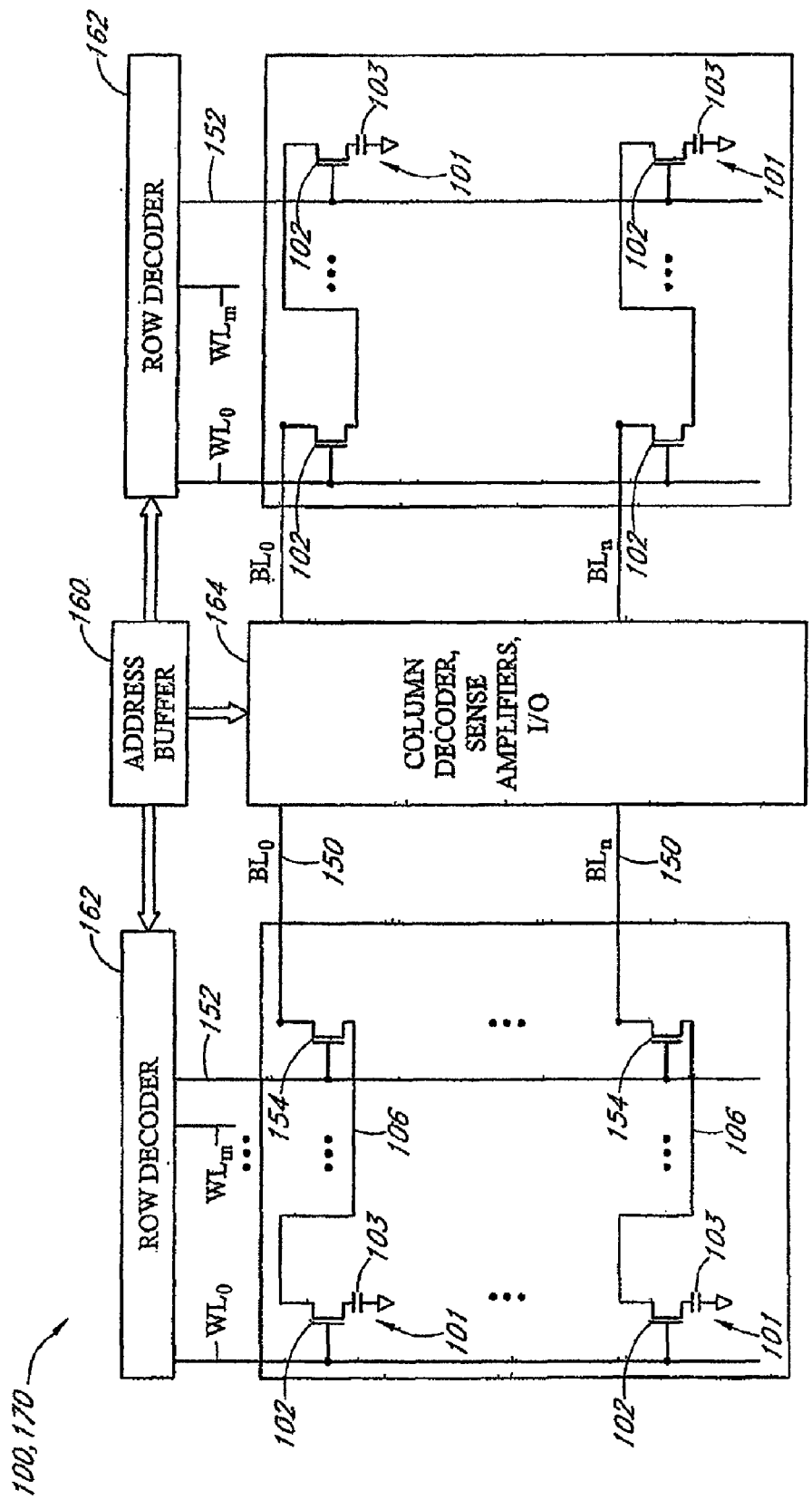
FIG. 24 is a circuit schematic illustration of one embodiment of a DRAM array.

Reference will now be made to the drawings of the various embodiments of the invention wherein like reference numerals will refer to like parts/structures throughout. FIGS. 5A, 5B, and 6 illustrate a top section view, side section view, and perspective view respectively of embodiments of a memory circuit access array 100, which in following will be referred to as the array 100 for brevity. The array 100 provides access with a plurality of memory cells 101, in certain embodiments an array of DRAM cells, which can be utilized for storage and access of information (FIG. 24). The array 100 comprises a plurality of cell access transistors 102 which are interconnected with corresponding charge storage devices to define the memory cells 101 in a memory array 170 (FIG. 24). In one embodiment, the charge storage devices comprise storage capacitors 103. Each of the access transistors 102 are in electrical communication with a corresponding word line 104 and local data/bit line 106. In this particular embodiment of the array 100, the word lines 104 are arranged generally parallel to each other at a pitch $p_2$. The local data/bit lines 106 are as well arranged substantially in parallel with each other at a pitch $p_1$, and also extending generally transversely with respect to the word lines 104. In one particular embodiment, a pair of word lines 104a and 104b are provided for any given cell access transistor 102 and are arranged on opposite sides of each access transistor 102.

The array 100 is formed on top of a semiconductive substrate 110, in one particular embodiment comprising silicon. As can be seen in the side section view of FIG. 5B, the local data/bit lines 106 extend across an upper surface of the substrate 110. In certain embodiments, the data/bit lines 106 comprise doped silicon regions of the substrate 110 and in one particular embodiment, n+ doped silicon. The array 100 also comprises a plurality of generally vertically extending ultra thin semiconductive pillars 112 forming a part of the structure of each access transistor 102. The pillars are generally aligned on top of corresponding buried local data/bit lines 106. Upper surfaces of the pillars 112 define capacitor contacts 144 for interconnection to corresponding storage capacitors 103 of the memory cells 101.

An insulator layer or dielectric 114 is positioned atop the substrate 110 and interposed portions of the data/bit lines 106 and includes gate insulator regions 116 which, in this embodiment, extend generally upward and substantially circumferentially enclose or encompass each of the semiconductive pillars 112. Thus, the semiconductive pillars 112 are generally configured as ultra-thin vertically extending posts, cylinders, prisms, or the like, and the respective gate insulator regions 116 are configured as corresponding hollow posts, pillars, cylinders, prisms, or the like with the inner surface of the gate insulator region 116 conforming in cross-section to the outer surface of the respective semiconductive pillar 112 such that the two are in contact with each other.

Figure 7:
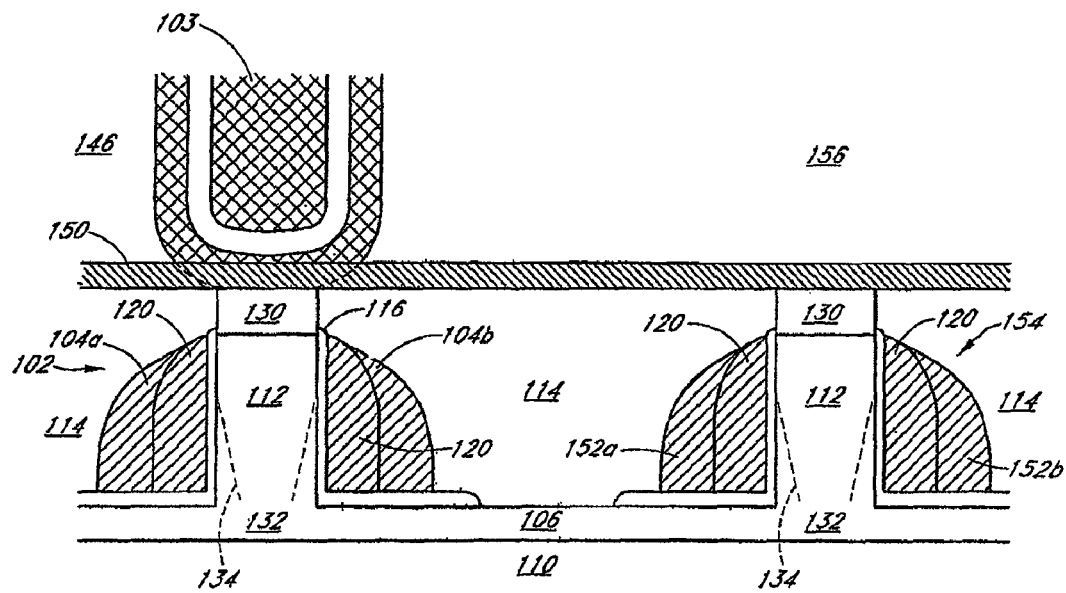
FIG. 7 is a side section view of one embodiment of an access transistor in a memory array with a global data/bit line and a sense amplifier footprint.

Similarly, the array 100 comprises a corresponding plurality of gate conductor structures 120 which are also configured as generally vertically extending structures substantially encompassing or encircling and overlaid about the respective gate insulator region 116 with the enclosed semiconductive pillar 112. In one particular embodiment, the gate conductors 120 comprise polycrystalline silicon (polysilicon). The gate conductors 120 are arranged with respect to corresponding word lines 104a and 104b, such that the gate conductor 120 is in electrical contact with the respective word line 104a along a first contact surface 122, and such that the gate conductor 120 is in electrical contact with the respective word line 104b along a second contact surface 124 which is arranged substantially opposite the first contact surface 122 (also FIG. 7).

Thus, as the word lines 104a and 104b comprise conductive material which is in electrical contact with the gate conductor 120, also comprising electrically conductive material, along the opposed first and second contact surfaces 122, 124, electrical potential which is provided via the word lines 104a, 104b will thus be conducted via the gate conductor 120 so as to substantially encompass or encircle the gate insulator region 116 and semiconductive pillar 112 which are arranged within the interior of the gate conductor 120. The electric potential/field within the pillars 112 will be substantially laterally or horizontally symmetric at a given vertical position of the pillar 112 and appropriate potentials will induce a generally annular tapered conduction channel 134 (see FIG. 7). A surround gate structure 126 is defined wherein an electrical potential can be provided substantially encircling or encompassing the enclosed semiconductive pillar 112 and wherein the gate insulator region 116 inhibits electrical conduction therebetween.

This surround gate structure 126 (see FIG. 6), by providing regulated electrical potential via the word lines 104a and 104b and further via the gate conductor 120 about substantially all lateral sides, faces, and directions of the generally vertically extending semiconductive pillar 112, provides even more control of a gate potential applied to/removed adjacent the pillar 112 as opposed to only a single side of a gate as in conventional bulk silicon processes and devices or the opposed sides of a dual gate and/or double gate MOSFET structure. In one embodiment, the doping of the pillars 112 is such that the transistors 102 operate from a substantially fully depleted state. Thus, in this embodiment, absence of an applied potential to the surround gate structure 126 substantially removes a conduction channel 134 (see also FIGS. 10A and 10B) thereby avoiding the need to apply a potential to turn off the transistors 102. This embodiment provides simplified and more convenient operation of the array 100 and facilitates integration with other systems.

FIG. 6 also illustrates that one embodiment of the array 100 also includes global data/bit lines 150. The global data/bit lines 150 comprise relatively highly conductive material for reduced line impedance. In various embodiments, the global data/bit lines 150 comprise aluminum alloys, copper alloys, and/or tungsten so as to have higher conductivity than the doped semiconductor material comprising the buried local data/bit lines 106 to provide lower resistance circuit paths.

In one embodiment, the global data/bit lines 150 are arranged generally parallel to the buried local data/bit lines 106. The global data/bit lines 150 are also arranged generally above the columns of access transistors 102. The global data/ bit lines 150 also extend generally underneath and between the stacked storage capacitors 103 (see FIGS. 6 and 7). Thus, in certain embodiments, the global data/bit lines 150 pass between generally vertically extending storage capacitors 103 generally at lower extents thereof without intersecting the storage capacitors 103 or their interconnections to associated access transistors 102.

In certain embodiments, selected columns of the access transistors 102 are "sacrificed" to define local data/bit access transistors 154. Similarly, corresponding word lines 104a, 104b are also "sacrificed" to define local data/bit access lines 152a, 152b. Rather than providing access to corresponding memory cells 101, the local data/bit access lines 152 and local data/bit access transistors 154 are aligned with and interconnected between overlying global data/bit lines 150 and underlying local data/bit lines 106. Thus, the local data/bit access transistors 154 can selectively interconnect the global data/bit lines 150 to the local data/bit lines 106. By applying appropriate potential to the local data/bit access lines 152a, 152b, the corresponding local data/bit access transistors 154 are turned on so as to provide corresponding conduction channels 134 between the local 106 and global 150 data/bit lines.

In one embodiment, columns of the access transistors 102 and corresponding word lines 104a, 104b are sacrificed to form the local data/bit line access transistors 154 and local data/bit access lines 152 at regular intervals of n. The value of n can be selected for the requirements of particular applications, however in certain embodiments is preferably in the range of $32 \leq n \leq 128$. In other embodiments, columns of the access transistors 102 and corresponding word lines 104a, 104b are sacrificed to form the local data/bit line access transistors 154 and local data/bit access lines 152 at irregular intervals. Thus, the relatively higher resistance local data/bit lines 106 extend a regular distance of n widths of access transistors 102 or selected irregular distances. Rather than extending much further with higher resistance as in certain conventional architectures, the higher resistance of the local data/bit lines 106 is limited by the intervals between columns of the local data/bit access transistors 154. The lower resistance global data/bit lines 150 can be selectively interconnected to corresponding data/bit lines 106 to provide a lower resistance path to corresponding access transistors 102 at the loss of relatively few access transistors 102 to form the local data/bit access transistors 154. This facilitates further scaling for increased device density/integration while mitigating difficulties with higher resistance buried doped semiconductor data/bit lines.

Figure 8:
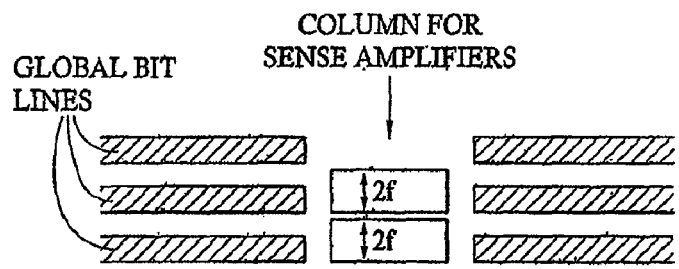
FIG. 8 illustrates a conventional prior art open bit line architecture.

FIG. 8 illustrates a conventional prior art open data/bit line architecture. In this conventional arrangement, bit lines extend parallel to each other and are broken by or terminate at a column of sense amplifiers. With required spacing between adjacent bit lines and with a minimum feature dimension f, a space for formation of the sense amplifiers of approximately 2f dimension is provided. With the desirable aggressive scaling to provide increased device density, it is a significant and frequently limiting impediment to fabricate suitable sense amplifiers in this limited space to allow further scaling.

Figure 9:
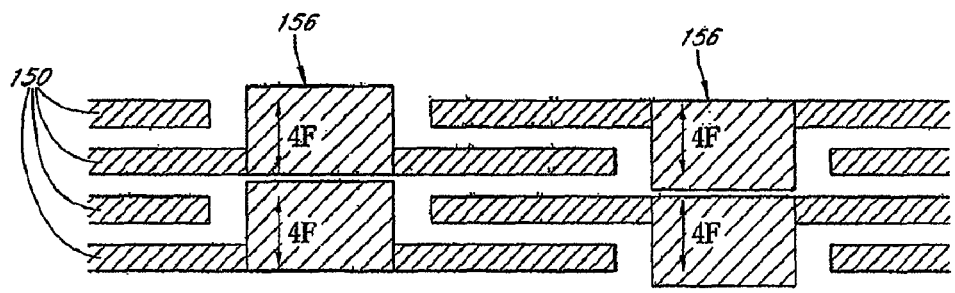
FIG. 9 illustrates one embodiment of a staggered data/bit line architecture with staggered sense amplifiers having increased pitch.

FIG. 9 illustrates one embodiment of the array 100 which mitigates these limitations of the prior art. FIG. 9 is a partial cut-away top view showing the global data/bit lines 150 formed with a device feature size and spacing F. The feature size or pitch F also corresponds substantially to the sizing and spacing of the underlying data/bit lines 106 which are obscured from view in this figure. As columns of the access transistors 102 are sacrificed to form the columns of local data/bit access transistors 154, sense amplifier footprints 156 are defined in this embodiment that are of 4F in dimension. As the area of the array 100 which could otherwise define a column of access transistors 102 is not used as such, but rather allocated for a column of the data/bit access transistors 154, this additional area can instead be allocated for the sense amplifier footprints 156.

Thus, in one embodiment wherein the array 100 comprises a substantially square array, the lateral dimensions available for the sense amplifier footprints is approximately doubled and the area is approximately quadrupled. Thus, one embodiment of the array 100 facilitates reduction of the feature size F by a factor of two while maintaining a comparable sense amplifier footprint 156 as compared to conventional architectures. This embodiment facilitates an increase in density of the memory cells 101 by a factor of almost four for a given sense amplifier footprint 156, e.g. without requiring reduction in the size of sense amplifiers, as compared to the conventional architecture illustrated in FIG. 8.

A further advantage of the array 100 is that the global data/bit lines 150 provide reduced resistance access to the access transistors 102 and sense amplifiers which can otherwise be troublesome with increased integration with the higher resistance of the local data/bit lines 106. More particularly, the corresponding access transistors 154 are activated when appropriate potential is applied to local data/bit access line(s) 152a, 152b. Conduction channels 134 are formed between the global bit lines 150 and the associated local data/bit lines 106 and thus to the associated access transistors 102 thus providing a relatively low resistance path between the respective sense amplifiers and the access transistors 102.

Figure 10A:
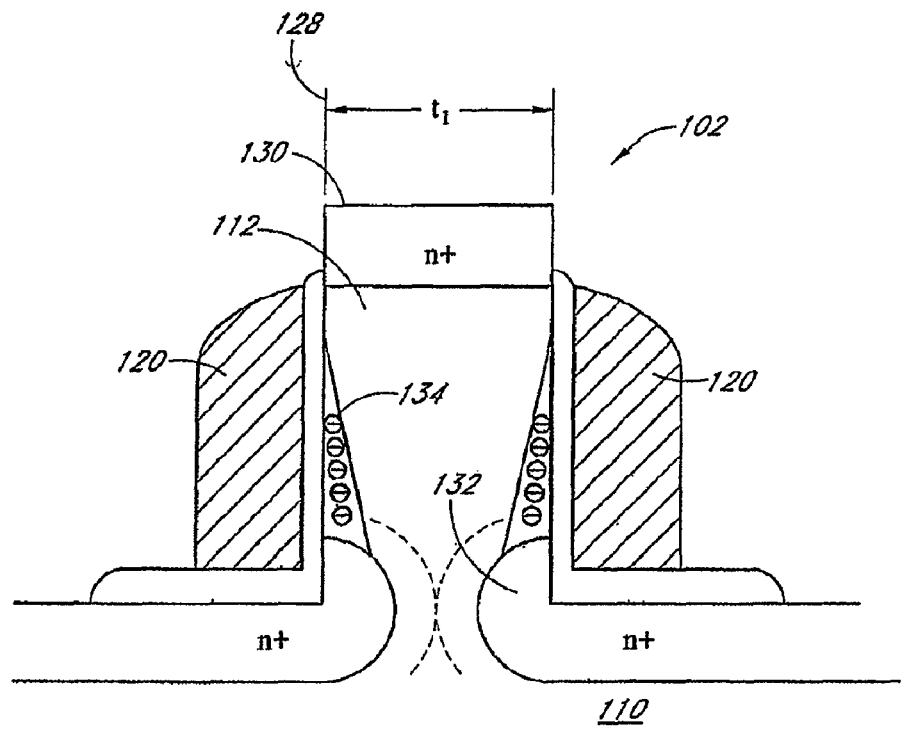
FIGS. 10A and 10B are side section views of two different embodiments of access transistors having different source region configurations.
Figure 10B:
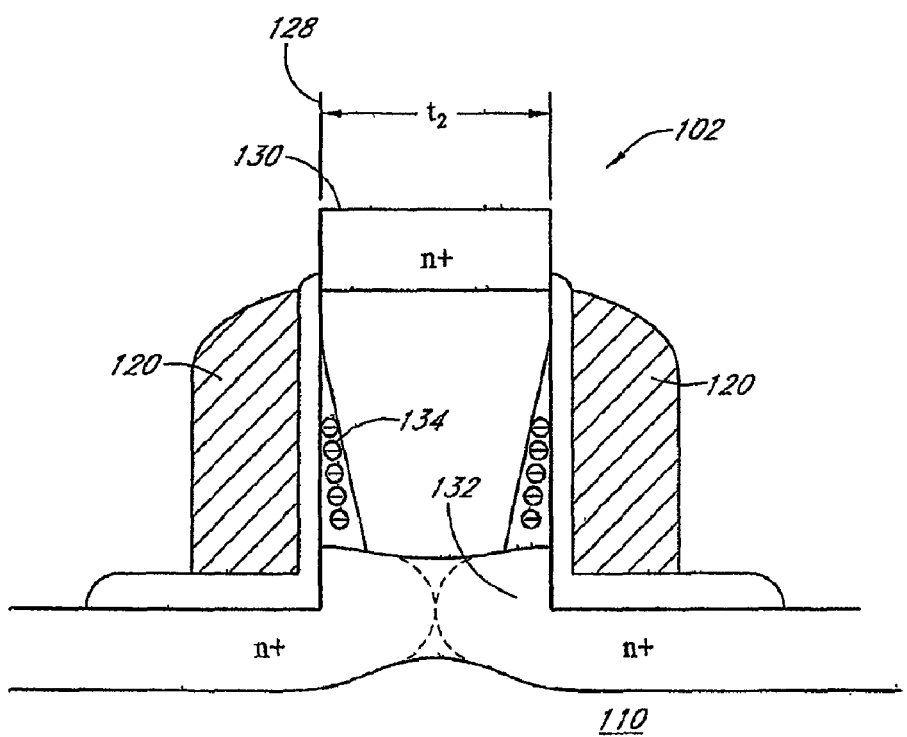

FIGS. 10A and 10B illustrates in side section view in greater detail embodiments of portions of the array 100 including the access transistors 102, 154 thereof. FIG. 10A illustrates one embodiment of the access transistors 102, 154, wherein the pillar 112 has a thickness 128 indicated as $t_1$ and similarly for FIG. 10B the pillar 112 having a pillar thickness 128 $t_2$. While the illustrations herein are schematic in nature and should not be interpreted as being to scale, in these embodiments the pillar thickness 128 $t_1$ is greater than the pillar thickness 128 $t_2$. It will be further appreciated that the pillar thickness 128 referred to can comprise multiple laterally-extending thickness measurements, such as in embodiments wherein the pillar 112 defines generally a rectangular prism structure, or generally a single lateral diameter dimension in embodiments wherein the pillar 112 defines generally a cylindrical vertically-extending structure.

In the embodiments illustrated in FIGS. 10A and 10B, drain regions 130 are defined generally adjacent the upper extent of the pillars 112 and source regions 132 positioned generally adjacent the lower extent of the pillars 112. In one particular embodiment, the drain region 130 and source region 132 comprise regions of the semiconductive pillar 112 which are doped n+. In these embodiments, when the transistors 102, 154 are in an off condition, the surround gate structure 126 will be at substantially a zero or a negative bias. In this case, the transistors 102, 154 of these embodiments offer better device characteristics than conventional bulk silicon MOSFETs. These improved device characteristics arise because the thin physical dimensions of the ultra-thin semiconductive pillars 112 facilitate full depletion of the transistors 102, 154 with relatively low doping levels. In one embodiment, a major pillar thickness 128 of approximately 100 nm with doped characteristics of approximately $1 \times 10^{15}/cm^3$ boron doping provides the transistors 102, 154 with substantially full depletion characteristics. Thus, embodiments of the array 100 offer increased circuit density with individual transistors 102, 154 having relatively low doping densities in the pillars 112 thereof which reduces the aforementioned problems with relatively high doping levels which would otherwise be indicated to mitigate short channel effects.

Further, because the surround gate structure 126 encloses all lateral sides of a conduction channel 134 rather than only on one side as in conventional MOSFETs or separate opposed sides as in a dual gate and/or double gate MOSFET, more effective control of the channel is provided. The conduction channels 134 of these embodiments will describe generally a vertically extending annulus or ring structure conforming generally to the cross-sectional contour of the corresponding semiconductive pillar 112. As previously noted, the conduction channels 134 are substantially horizontally symmetric at a given vertical position of the pillars 112. With the surrounding gate structure 126 combined with the ultra thin semiconductive pillar 112, electric field generated by the drain region 130 is better screened from the source region 132 at the opposite end of the conduction channel 134, thereby reducing subthreshold and standby leakage current therebetween. As previously indicated, this leakage current is a significant device parameter of the memory array 170, particularly when the array 100 is configured as an array of DRAMs. The subthreshold and leakage current is a significant variable in determining the maximum retention time and the corresponding requirements for refreshing of logic states stored in the array 170 and the corresponding time or intervals between required refresh operations.

During read and write operations to the various cells of the array 170, the surround gate structure 126 is biased positive to a value based on the particular application, however generally on the order of a few tenths of a volt. Depending upon the pillar thickness 128, as well as the implantation and diffusion parameters employed for the particular application of the array 170, the source region 132 may or may not substantially extend across the lower extent of the semiconductive pillar 112. Thus, in the embodiment of FIG. 10A, wherein the pillar thickness 128 is somewhat thicker as indicated by $t_1$, the source region 132 would not extend entirely across the lower extent of the semiconductive pillar 112. In contrast, in the embodiment illustrated by FIG. 10B, the pillar thickness 128 is relatively thinner or narrower indicated as $T_2$, and in this embodiment, the source region 132 would extend substantially across the bottom or lower extent of the semiconductive pillar 112. As the source region 132 of the embodiment illustrated in FIG. 10B extends across the base of the pillar 112 and thus provides a full p/n junction across the lower extent of the pillar 112, this embodiment is generally preferred. Because the pillar thickness 128 is ultra-narrow, preferably 100 nm or less, application of high temperature processes to induce lateral diffusion of implanted dopants to form the source regions 132 is reduced, thereby avoiding the problematic aspects of more extreme high temperature parameters such as would be required with wide pillar structures. For example, in one embodiment, the array 170 is formed with high temperature process parameters not exceeding approximately 800° C. and 50 min. and as described in greater detail below.

Figure 11A:
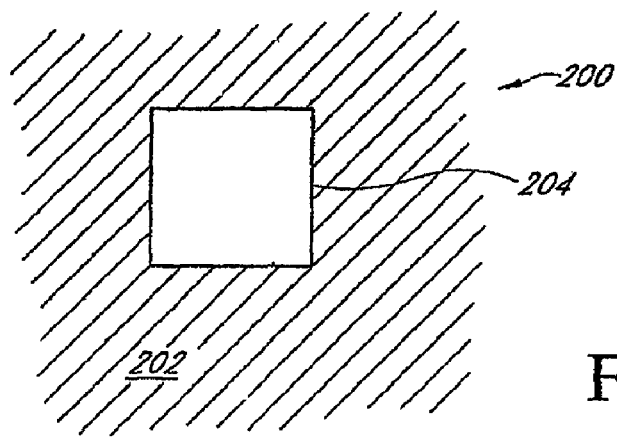
Figure 11B:
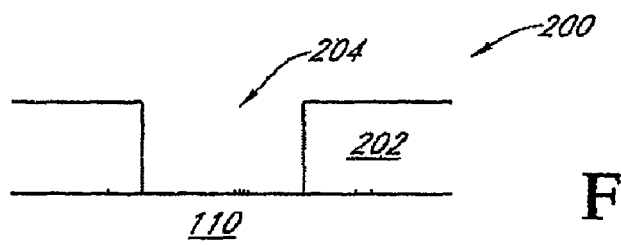
Figure 12A:
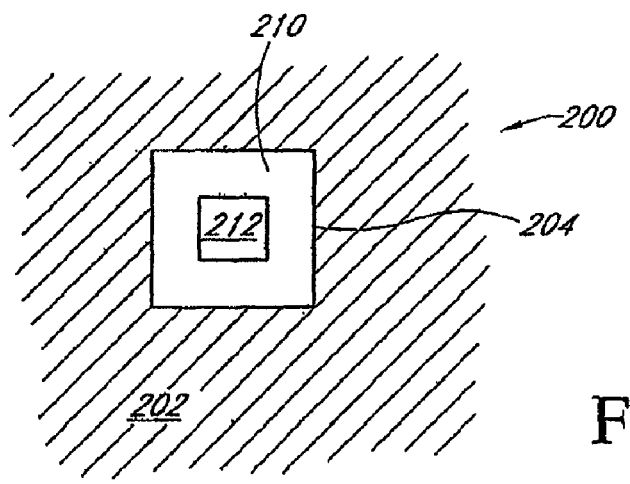
Figure 12B:
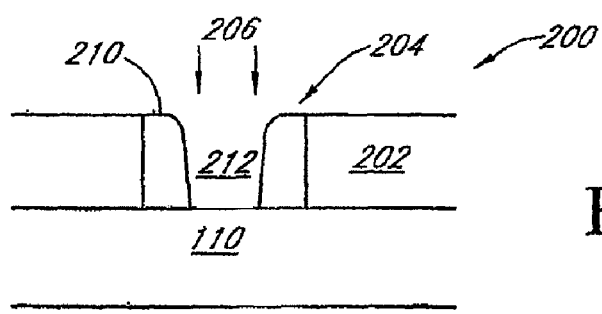
Figure 13A:
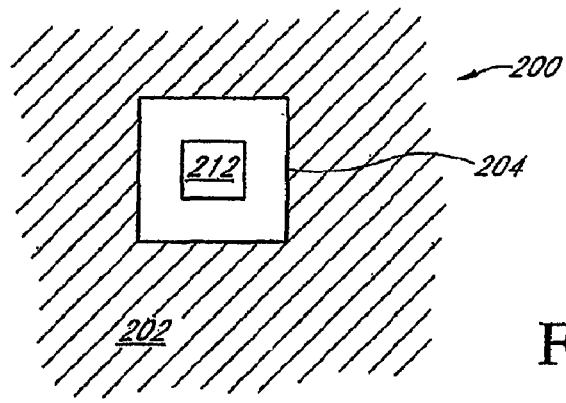
Figure 13B:
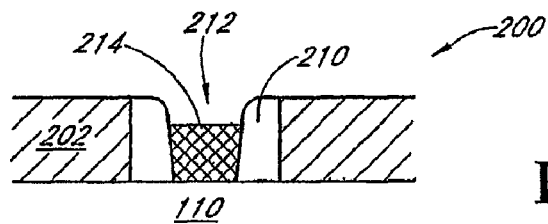

FIGS. 11A and 11B through 14A and 14B illustrate schematically one embodiment of a method 200 of forming ultra thin body transistors, such as the access transistors 102, 154 previously described, wherein the transistors 102, 154 have sub-lithographic dimensions. In this particular embodiment, the transistors 102, 154 are formed by a side wall spacer technique described in greater detail below. As shown in FIGS. 11A and 11B, in top and side section views respectively, a mask material 202 is formed on top of the underlying substrate 110 and an opening 204 is formed in the mask layer 202 so as to expose a portion of the underlying substrate 110. The opening 204 is formed generally to conform to the desired cross-sectional shape of the surround gate structure 126 and semiconductive pillar 112. Thus, while a generally square-shaped opening 204 is illustrated, this is for ease of illustration and is only one of many possible shapes of the opening 204.

Following, as shown in FIGS. 12A and 12B, again in top and side section views respectively, spacer material, in one embodiment comprising silicon oxide, is deposited within the opening 204 of the mask layer 202. This spacer material is subjected to an anisotropic etch 206 so as to form a sidewall spacer structure 210 positioned generally against inner surfaces of the opening 204 formed in the mask layer 202 and further so as to form a generally centrally positioned hole 212 generally in the center of the sidewall spacer structure 210 and the opening 204. Then, as shown in FIGS. 13A and 13B, again in top and side section views respectively, a pillar plug 214 is formed within the generally centrally located hole 212 in the sidewall spacer structure 210. In one embodiment, the pillar plug 214 comprises silicon nitride which is deposited, planarized, and etched so as to partially recess the pillar plug 214 within the hole 212. This pillar plug 214 is subsequently utilized as a masking structure for etching of the underlying substrate 110 so as to define the semiconductive pillars 112. Thus, the profile and dimensions of the pillar plug 214 generally corresponds to the subsequently formed semiconductive pillars 112.

Figure 14A:
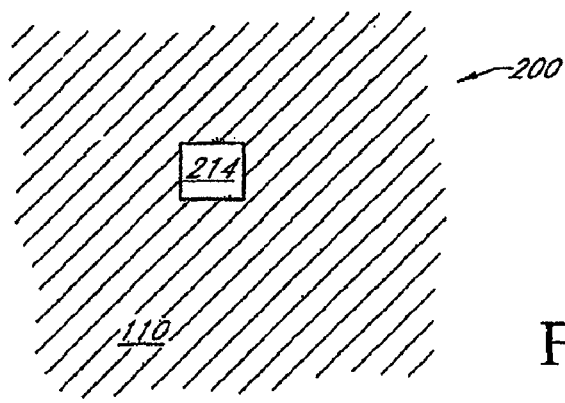
Figure 14B:
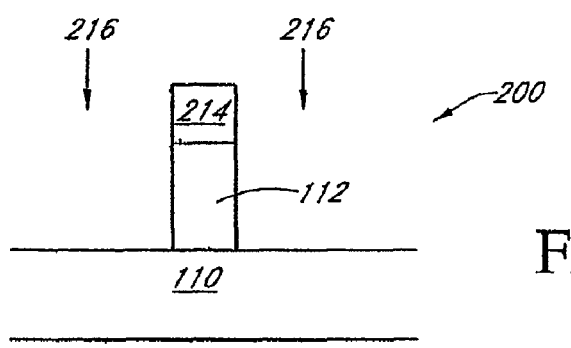

Then, as shown in FIGS. 14A and 14B, the mask 202 and side wall spacer structure 210 are removed so as to leave the pillar plug 214. An etch 216 is performed to remove portions of the upper surface of the substrate 110 with the pillar plug 214 as a masking structure. Thus, the vertically extending pillar 112 is defined extending upwards from the upper surface of the substrate 110.

FIGS. 15A-19A, 15B-19B, 20, and 21 illustrate steps of another embodiment of a method 300 for forming pillars 112 for the ultra thin body transistors 102. In this embodiment, a mask layer 302 is formed on top of the underlying substrate 110 and a generally elongate first mask opening 304 is formed therein. For ease of illustration and understanding, certain steps of the method 300 will be illustrated with respect to formation of a single semiconductive pillar 112, however, it will be understood that generally the method 300 would be employed to fabricate a plurality of the pillars 112 so as to subsequently define the array 100.

As shown in FIGS. 15A and 15B in top and end section view respectively, a first mask layer 302 is formed on the substrate 110 with a plurality of first openings 304 formed therein so as to expose generally parallel elongate trenchlike structures. Following as illustrated in FIGS. 16A and 16B, sidewall material is formed within the first opening 304 and exposed to an anisotropic etch 306 so as to define first sidewall spacers 310 which also extend in an elongate manner generally along the sides of the first opening 304 formed in the mask layer 302. The anisotropic etch 306 further defines a first central trench 312 which similarly extends in an elongate manner between opposed sidewall spacers 310.

As shown in FIGS. 17A and 17B in top and end section views respectively, a first plug strip 314 is formed within the first central trench 312 and in one particular embodiment comprises silicon nitride which is deposited, planarized, and etched so as to form the first plug strip 314 generally in a similar manner to that previously described for the pillar plug 214 of the method 200.

Following as illustrated in FIGS. 18A and 18B, again in top and end section views respectively, an etch 316 is performed employing the first plug strip 314 as a masking structure so as to define a plurality of underlying generally vertically extending pillar strips 320, which are elongate extending generally upward from the substrate 110 and corresponding generally to the contour and dimensions of the first plug strips 314. As further illustrated in FIGS. 19A and 19B, again in top and end section views respectively, the first plug strips 314 are removed, and the spaces between the first pillar strips 320 and above the substrate 110 are formed with a fill material 322 which, in one embodiment, comprises a back filling with silicon oxide.

Following as illustrated in FIG. 20 in top view, the preceding steps of the method 300 are repeated substantially as previously described, however with the difference that the structures previously described, such as the first pillar strips 320, are formed aligned generally along a first direction 324 and the following structures are fabricated oriented generally along a perpendicularly arranged second direction 326. Thus, as illustrated in FIG. 20, a second mask layer 332 is formed with a second opening 334 formed to extend generally in the second direction 326. These structures are formed to overlay the previously formed pillar strips 320 and fill material 322 which are illustrated in dashed lines and with parenthetical reference numbers. Similarly, a sidewall material is formed within the second opening 334 and exposed to an anisotropic etch 336 so as to define second sidewall spacers 340 and a second central trench 342 positioned generally between the opposed sidewall spacers 340, again with these structures oriented generally in the second direction 326. The second central trench 342 is again filled with material so as to form a second plug strip 344, again extending generally along the second direction 326.

Figure 21:
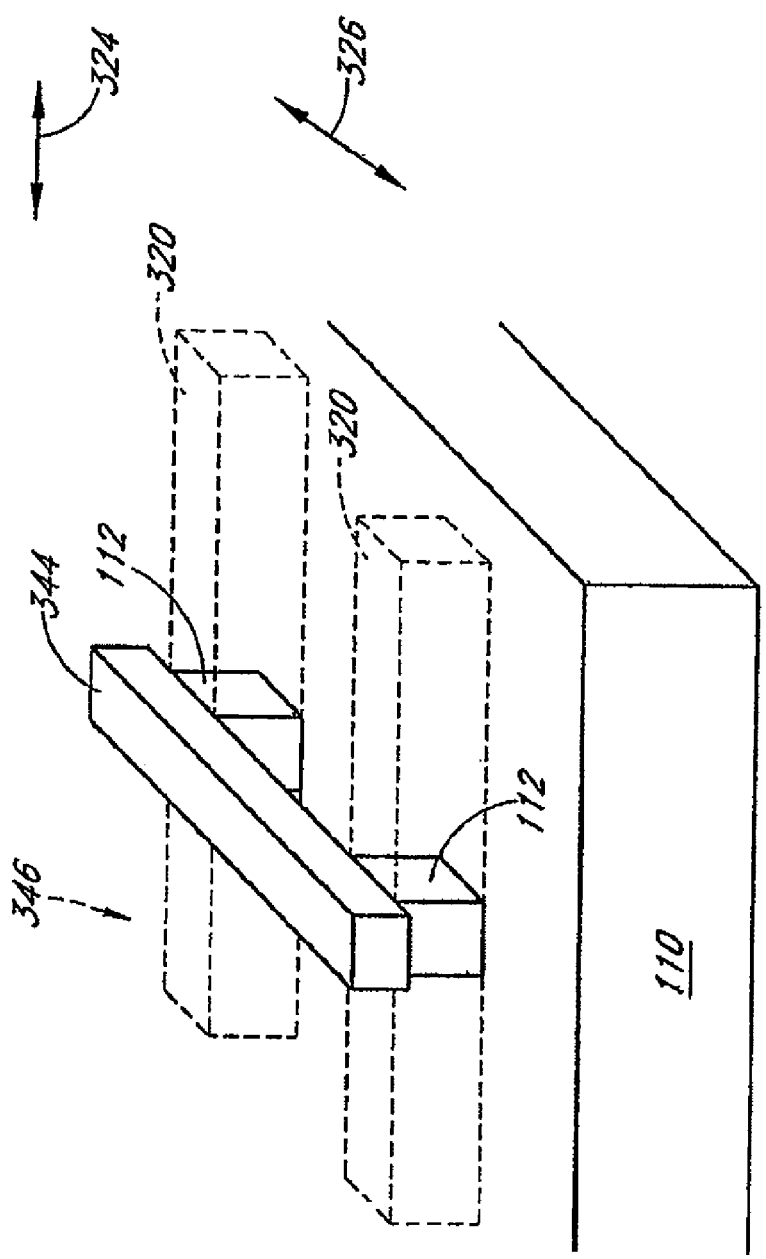
FIG. 21 is a perspective view of yet a further step in one embodiment of fabricating an ultra-thin body transistor array.

Then as illustrated in perspective view in FIG. 21, an etch 346 is performed employing the second plug strip 344 as a masking structure. As the second plug strip 344 extends generally along the second direction 326 and overlies the previously formed pillar strips 320 extending generally in the first direction 324, the excess material of the first pillar strips 320 not masked by the intersecting second plug strip 344 is removed during the etch process 346 so as to define a corresponding plurality of generally vertically extending semiconductive pillars 112 extending generally vertically upward from the underlying substrate 110. Thus, in these embodiments, the size and configuration of the resultant semiconductive pillars 112 corresponds to the intersection envelope between the first plug strips 314 and second plug strips 344. In certain applications, the embodiments of the method 300 may provide advantages compared to the embodiments of the method 200 as the profile of the resultant semiconductive pillars 112 is defined by the intersection of the edges of the first plug strip 314 and second plug strip 344 which are configured as elongate strips rather than the single pillar plugs 214 of the method 200. In certain applications, edges may be more precisely defined than the contour of individual holes, such as the central hole 212.

Figure 22A:
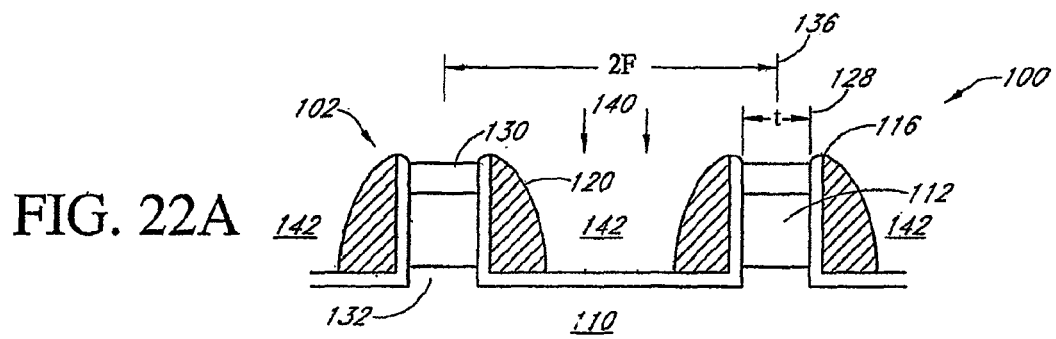
FIGS. 22A and 22B are side section and top views respectively of one embodiment of a method of forming surround gate structures.

FIGS. 22A, 22B, 23A, and 23B illustrate the further fabrication of the surround gate structures 126 and word lines 104 in this embodiment in a side wall spacer based process. As shown in FIG. 22A, the respective pillars 112 define a device to device spacing 136, separated by a distance 2F as shown. The pillars 112 also define a pillar thickness 128 indicated by t in FIG. 15. In these embodiments, the pillar thickness 128 is much less than the photolithographic dimension limit F, and thus the array 100 defines device features, such as the pillar thickness 128, which are below the photolithographic dimension F.

Figure 22B:
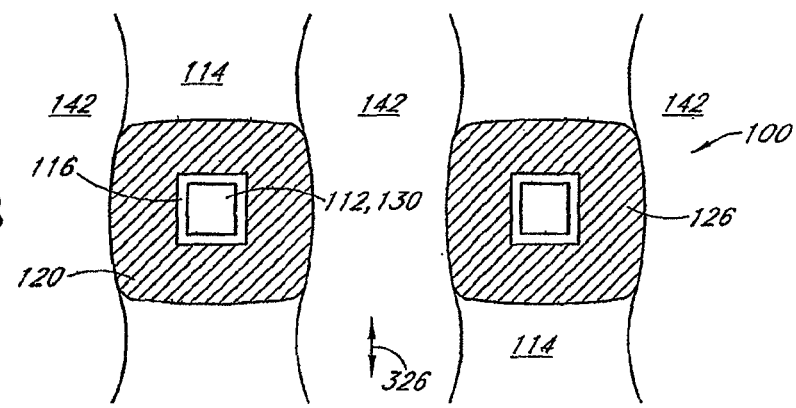

As shown in FIG. 22A, the gate insulator region 116 is grown or deposited and then polysilicon is further deposited on the gate insulator regions 116. An anisotropic etch 140 is then performed so as to define sidewall structures of the encompassing gate insulator region 116 and surrounding gate conductor 120. Then, as shown in FIG. 22B, in one embodiment, this structure is back filled, such as with the insulator layer 114 comprising oxide. Trenches 142 are formed in this back fill material, such as the insulator layer 114, wherein the trenches are interposed between adjacent transistors 102 and in one particular embodiment, extending generally in the second direction 326.

Figure 23A:
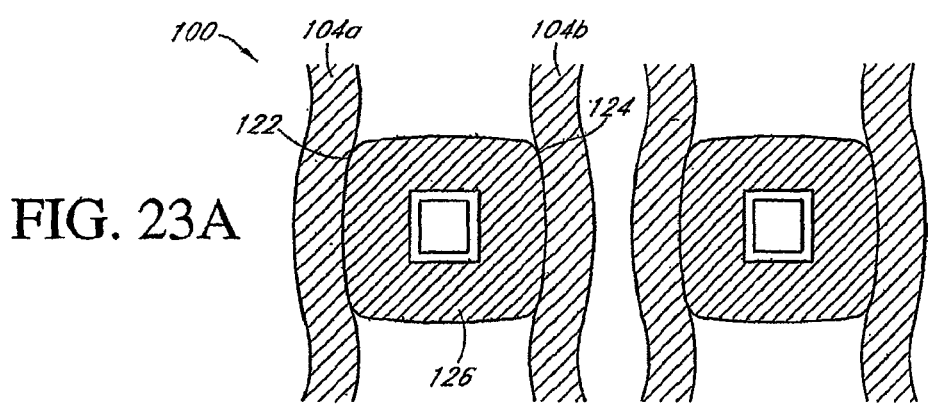
FIGS. 23A and 23B are side section and top views respectively of one embodiment of a method of forming word/address lines in enclosing contact with the surround gate structures.
Figure 23B:
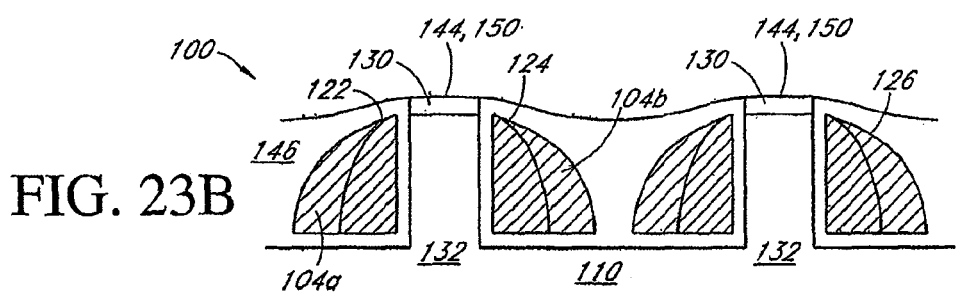

As shown in FIG. 23A, polysilicon or metal is deposited and anisotropically etched so as to be in contact generally at the first surface 122 and opposed second surface 124 defining the word/address lines 104a and 104b. The remainder of the process to form the array 100, for example, establishment of capacitor contacts 144 and formation of cap/passivation structures 146 as shown in FIG. 23B (also FIG. 5B) can be formed using conventional techniques well understood by one of ordinary skill in the art. In one embodiment, the cap/passivation structures 146 comprise dielectric material which is coextensive with the insulator layer 114 in at least certain regions. In one embodiment, the storage capacitors 103 are formed in this coextensive dielectric layer. It will also be understood that certain intermediate processes, such as implants/diffusion processes for example to dope the pillars 112 to form the drain 130 and source 132 regions to form the array 100 will also be well understood by one of ordinary skill.

FIG. 24 is a circuit schematic of one embodiment of memory array 170. As previously described, the array 170 comprises the access array 100 comprising access transistors 102 and associated word lines 104a, 104b $WL_0$ through $WL_m$, local data/bit lines 106, global data/bit lines 150 $BL_0$ through $BL_n$, local data/bit access lines 152, and local data/bit access transistors 154. The array 100 is interconnected with a corresponding plurality of storage capacitors 103 via the capacitor contacts 144 to define a plurality of memory cells 101. The electrical operation of the memory cells 101 comprising the storage capacitors 103 and access transistors 102 for storage of digital data proceeds according to well understood principles.

The array 170 also comprises in one embodiment one or more row decoder modules 162, one or more column decoder/sense amplifier modules 164, and an address buffer 160. The row decoder(s) 162 are connected to the plurality of word lines 104a, 104b $WL_0$ through $WL_m$ or local data/bit access lines 152a, 152b. The column decoder/sense amplifier module(s) are connected to the global data/bit lines 150 $BL_0$ through $BL_n$ and thus, via selected local data/bit access transistors 154, to selected local data/bit lines 106. The address buffer 160 is connected with both the row decoder(s) 162 and the column decoder/sense amplifier module(s) 164. The address buffer 160 provides appropriate signals to the row decoder(s) 162 and the column decoder/sense amplifier module(s) 164 to access the memory cells 101 in a well understood manner. The sense amplifiers of the module 164 can provide amplified signals to the address buffer 160 indicative of the charge stored on the storage capacitors 103 corresponding to the data state of the corresponding memory cells 101. Further details for operation and fabrication of the address buffer 160, the row decoder(s) 162, and the column decoder/sense amplifier module(s) 164 will be well understood by one of ordinary skill.

Thus, the aforementioned embodiments describe methods 200 and 300 for forming an array 100 of memory cells, such as an array of DRAM cells, having access transistors 102 with semiconductive pillars 112 of ultra thin dimensions. In certain embodiments, the device dimensions, such as the pillar thickness 128, are much less than a photolithographic process limit F providing particularly efficient and densely packed components of the array 100. Further advantages of the embodiments described herein are the formation of a surround gate structure 126 which provides more effective control of the conduction channel 134 with the aggressive scaling provided by these embodiments. Furthermore, certain embodiments provide a substantially fully depleted pillar 112 structure of ultra-thin dimensions which reduces the need for extremely high doping levels to reduce short channel effects and the attendant problems of high doping levels.

Low resistance global data/bit lines 150 are provided in certain embodiments which can be selectively interconnected via the data/bit access transistors 154 with local data/bit lines 106 to provide lower resistance paths between sense amplifiers and the memory cells 101. This aspect mitigates the limitations of the relatively higher resistance buried data/bit lines for increased integration. Embodiments also provide a staggered sense amplifier footprint 156 architecture which provides increased space for fabrication of sense amplifiers to mitigate limitations in further scaling arising from further reducing the size of sense amplifiers.

Although the foregoing description of the preferred embodiment of the present invention has shown, described, and pointed out the fundamental novel features of the invention, it will be understood that various omissions, substitutions, and changes in the form of the detail of the apparatus as illustrated, as well as the uses thereof, may be made by those skilled in the art without departing from the spirit of the present invention.

What is claimed is:

1. A memory array comprising:
   a semiconductor substrate;
   sidewall structures arranged against inner surfaces of openings in sidewall material, wherein the sidewall structures have holes formed therein and wherein the openings are aligned generally with first data/bit lines;
   a plurality of vertical extensions within the holes extending generally vertically from a surface of the semiconductor substrate, wherein the vertical extensions are aligned generally with the first data/bit lines;
   gate structures formed about the vertical extensions such that the gate structures encompass at least a portion of the vertical extensions; and
   second data/bit lines extending across the vertical extensions.

2. The memory array of claim 1, wherein the first data/bit lines comprise a plurality of local data/bit lines in the surface of the substrate.

3. The memory array of claim 1, further comprising plug structures that comprise silicon nitride.

4. The memory array of claim 1, further comprising a plurality of openings in a mask layer on the surface of the substrate such that the openings have a generally square horizontal cross-section.

5. The memory array of claim 1, further comprising at least one local data/bit access line arranged to contact at least one column of corresponding gate structures at least first surfaces thereof so as to define local data/bit access transistors and a plurality of word lines arranged to contact remaining columns of corresponding gate structures at least first surfaces thereof so as to define cell access transistors.

6. The memory array of claim 5, comprising pairs of word lines for corresponding gate structures wherein the pairs are arranged such that a first word line contacts the gate structures at the first surfaces and a second word line contacts the gate structures at opposed second surfaces.

7. The memory array of claim 1, wherein the vertical extensions are doped at lower ends so as to define source regions and at upper regions so as to define drain regions wherein the source regions are in electrical communication with corresponding first data/bit lines so as to define transistor structures having substantially fully depleted characteristics.

8. The memory array of claim 7, wherein the source regions extend substantially fully across the lower regions of the vertical extensions.

9. A memory array comprising:
   a semiconductor substrate;
   sidewall structures arranged against inner surfaces of openings, wherein the sidewall structures have holes formed therein and wherein the openings are aligned generally with first data/bit lines;
   a plurality of vertical extensions within the holes, wherein the vertical extensions are aligned generally with the first data/bit lines;
   gate structures about the vertical extensions; and
   second data/bit lines extending over the vertical extensions.

10. The memory array of claim 9, wherein the surface of the substrate is doped to define the first data/bit lines.

11. The memory array of claim 9, further comprising plug structures that comprise silicon nitride.

12. The memory array of claim 9, wherein the openings in the masking layer have a generally square horizontal cross-section.

13. The memory array of claim 9, wherein at least one data/bit access line is arranged to contact at least one column of corresponding gate structures at least first surfaces thereof so as to define data/bit access transistors.

14. The memory array of claim 13, further comprising a plurality of word lines arranged to contact columns of corresponding gate structures at least first surfaces thereof so as to define cell access transistors.

15. The memory array of claim 14, further comprising pairs of word lines for corresponding gate structures and arranging the pairs such that a first word line contacts the gate structures at first surfaces and a second word line contacts the gate structures at opposed second surfaces.

16. The memory array of claim 9, further comprising vertical extensions doped at lower ends thereof so as to define source regions and at upper regions thereof so as to define drain regions wherein the source regions are in electrical communication with the corresponding first data/bit lines so as to define transistor structures having substantially fully depleted characteristics.

17. The memory array of claim 16, wherein the source regions extend substantially fully across the lower regions of the vertical extensions.

* * * * *

UNITED STATES PATENT AND TRADEMARK OFFICE
CERTIFICATE OF CORRECTION

PATENT NO. : 8,101,992 B2
APPLICATION NO. : 12/950088
DATED : January 24, 2012
INVENTOR(S) : Leonard Forbes Page 1 of 1

It is certified that error appears in the above-identified patent and that said Letters Patent is hereby corrected as shown below:

In column 13, line 61, in Claim 5, delete "structures at least" and insert -- structures at at least --, therefor.

In column 14, line 3, in Claim 5, delete "structures at least" and insert -- structures at at least --, therefor.

In column 14, line 40, in Claim 13, delete "structures at least" and insert -- structures at at least --, therefor.

In column 14, line 44, in Claim 14, delete "structures at least" and insert -- structures at at least --, therefor.

Signed and Sealed this
Twenty-seventh Day of March, 2012

David J. Kappos
*Director of the United States Patent and Trademark Office*